(12) United States Patent
Yu et al.

(10) Patent No.: US 12,230,513 B2
(45) Date of Patent: Feb. 18, 2025

(54) CROSS-WAFER RDLs IN CONSTRUCTED WAFERS

(71) Applicant: Taiwan Semiconductor Manufacturing Co., Ltd., Hsinchu (TW)

(72) Inventors: Chen-Hua Yu, Hsinchu (TW); Tin-Hao Kuo, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 0 days.

(21) Appl. No.: 18/410,365

(22) Filed: Jan. 11, 2024

(65) Prior Publication Data

US 2024/0145257 A1 May 2, 2024

Related U.S. Application Data

(63) Continuation of application No. 17/660,501, filed on Apr. 25, 2022, now Pat. No. 11,908,706, which is a
(Continued)

(51) Int. Cl.
*H01L 21/56* (2006.01)
*H01L 21/768* (2006.01)
(Continued)

(52) U.S. Cl.
CPC ...... *H01L 21/565* (2013.01); *H01L 21/76802* (2013.01); *H01L 23/3121* (2013.01);
(Continued)

(58) Field of Classification Search
CPC ............. H01L 21/565; H01L 21/76802; H01L 23/3121; H01L 23/5226; H01L 23/5383;
(Continued)

(56) References Cited

U.S. PATENT DOCUMENTS

| 5,422,514 A | 6/1995 | Griswold |
| 7,518,235 B2 | 4/2009 | Coico et al. |

(Continued)

FOREIGN PATENT DOCUMENTS

| CN | 106158819 A | 11/2016 |
| CN | 106816421 A | 6/2017 |

(Continued)

OTHER PUBLICATIONS

Fang et al., "Emerging Fine Line Panel Level Fan Out Technology," 2018 China Semiconductor Technology International Conference (CSTIC), Mar. 11-12, 2018, 4 pages.

(Continued)

*Primary Examiner* — J. E. Schoenholtz
(74) *Attorney, Agent, or Firm* — Slater Matsil, LLP

(57) ABSTRACT

A method includes placing a plurality of package components over a carrier, encapsulating the plurality of package components in an encapsulant, forming a light-sensitive dielectric layer over the plurality of package components and the encapsulant, exposing the light-sensitive dielectric layer using a lithography mask, and developing the light-sensitive dielectric layer to form a plurality of openings. Conductive features of the plurality of package components are exposed through the plurality of openings. The method further includes forming redistribution lines extending into the openings. One of the redistribution lines has a length greater than about 26 mm. The redistribution lines, the plurality of package components, the encapsulant in combination form a reconstructed wafer.

20 Claims, 24 Drawing Sheets

Related U.S. Application Data continuation of application No. 17/087,147, filed on Nov. 2, 2020, now Pat. No. 11,315,805, which is a continuation of application No. 16/273,836, filed on Feb. 12, 2019, now Pat. No. 10,825,696.

(60) Provisional application No. 62/693,171, filed on Jul. 2, 2018.

(51) Int. Cl.
  *H01L 23/00* (2006.01)
  *H01L 23/31* (2006.01)
  *H01L 23/522* (2006.01)
  *H01L 23/538* (2006.01)
  *H01L 25/18* (2023.01)

(52) U.S. Cl.
  CPC ...... *H01L 23/5226* (2013.01); *H01L 23/5383* (2013.01); *H01L 23/5386* (2013.01); *H01L 24/09* (2013.01); *H01L 24/17* (2013.01); *H01L 25/18* (2013.01); *H01L 2224/0231* (2013.01); *H01L 2224/02375* (2013.01); *H01L 2224/02381* (2013.01)

(58) Field of Classification Search
  CPC ..... H01L 23/5386; H01L 24/09; H01L 24/17; H01L 25/18; H01L 2224/0231; H01L 2224/02375; H01L 2224/02381; H01L 23/473; H01L 23/49816; H01L 25/105; H01L 2224/16227; H01L 2224/24195; H01L 2224/73267; H01L 2224/96; H01L 2225/1035; H01L 2225/1094; H01L 2924/19041; H01L 2924/19042; H01L 24/19; H01L 25/0655; H01L 21/561; H01L 2221/68345; H01L 2221/68359; H01L 2224/04105; H01L 2224/12105; H01L 2224/24137; H01L 2225/1058; H01L 2924/15311; H01L 2924/18162; H01L 2924/19043; H01L 2924/19105; H01L 21/6835; H01L 2224/18; H01L 21/568; H01L 24/02; H01L 2224/02379; H01L 21/0337; H01L 21/52; H01L 23/28; H01L 23/485; H01L 24/97; G03F 7/2012

See application file for complete search history.

(56) References Cited

U.S. PATENT DOCUMENTS

| | | | |
|---|---|---|---|
| 7,581,235 | B2 | 8/2009 | Oota |
| 7,796,395 | B2 | 9/2010 | Kim |
| 8,361,842 | B2 | 1/2013 | Yu et al. |
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 9,543,249 | B1 | 1/2017 | Hu |
| 10,157,899 | B2 | 12/2018 | Yu et al. |
| 10,566,288 | B2 | 2/2020 | Kao et al. |
| 10,825,696 | B2 * | 11/2020 | Yu .......................... H01L 25/18 |
| 11,315,805 | B2 * | 4/2022 | Yu ....................... H01L 23/5226 |
| 11,502,013 | B2 | 11/2022 | Chun et al. |
| 11,908,706 | B2 * | 2/2024 | Yu .......................... H01L 24/17 |
| 2009/0140442 | A1 | 6/2009 | Lin |
| 2011/0291288 | A1 | 12/2011 | Wu et al. |
| 2013/0001776 | A1 | 1/2013 | Yu et al. |
| 2013/0016477 | A1 | 1/2013 | Yokoya et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2014/0203429 | A1 | 7/2014 | Yu et al. |
| 2014/0225222 | A1 | 8/2014 | Yu et al. |
| 2014/0239488 | A1 | 8/2014 | Kobayashi et al. |
| 2014/0252646 | A1 | 9/2014 | Hung et al. |
| 2014/0264930 | A1 | 9/2014 | Yu et al. |
| 2015/0084206 | A1 | 3/2015 | Lin |
| 2015/0166329 | A1 | 6/2015 | Cheng et al. |
| 2015/0364386 | A1 | 12/2015 | Yu et al. |
| 2016/0155723 | A1 | 6/2016 | Lou |
| 2016/0197067 | A1 | 7/2016 | Wu |
| 2017/0033080 | A1 | 2/2017 | Chen et al. |
| 2017/0084590 | A1 | 3/2017 | Yu et al. |
| 2017/0084596 | A1 | 3/2017 | Scanlan |
| 2017/0179078 | A1 | 6/2017 | Jung |
| 2017/0196075 | A1 | 7/2017 | Barron et al. |
| 2017/0372935 | A1 | 12/2017 | Val |
| 2018/0233425 | A1 | 8/2018 | Yu |
| 2018/0261554 | A1 | 9/2018 | Huang et al. |
| 2019/0333851 | A1 | 10/2019 | Agarwal et al. |

FOREIGN PATENT DOCUMENTS

| | | |
|---|---|---|
| KR | 100955936 B1 | 5/2010 |
| KR | 20160029648 A | 3/2016 |
| KR | 20170063345 A | 6/2017 |

OTHER PUBLICATIONS

Hacker News, https://news.ycombinator.com/iten?id=14309843, Dec. 12, 2019, 1 page.

Kripesh, et al., "Design and Development of a Multi-Die Embedded Micro Wafer Level Package," 58th Electronic Components and Technology Conference, May 27-30, 2008, 7 pages.

Lau, John, "Fan-Out Wafer-Level Packaging for 3DIC Heterogeneous Integration," IEEE/EPS Chapter Lecture in the Silicon Valley Area, Jan. 25, 2018, 79 pages.

Rao et al., "Development of High Density Fan Out Wafer Level Package (HD FOWLP) With Multi-layer Fine Pitch RDL for Mobile Applications," 2016 IEEE 66th Electronic Components and Technology Conference (ECTC), May 31-Jun. 3, 2016, pp. 1522-1529.

Strothmann, Tom, "Optimizing Equipment Selection for Diverse Fan-Out Process Flows," Semicon Taiwan, Jun. 21, 2016, 22 pages.

Zoberbier et al., "SUSS Microtec's Unique DSC300 GEN2 Platform—Combined Projection Lithography Performance With Advantages of Full-Field Exposure," SUSS Report, 2015, 10 pages.

Zoschke, et al., "Full Wafer Redistribution and Wafer Embedding as Key Technologies for a Multi-Scale Neuromorphic Hardware Cluster," 2017 IEEE 19th Electronics Packaging Technology Conference (EPTC), Dec. 6-9, 2017, 8 pages.

* cited by examiner

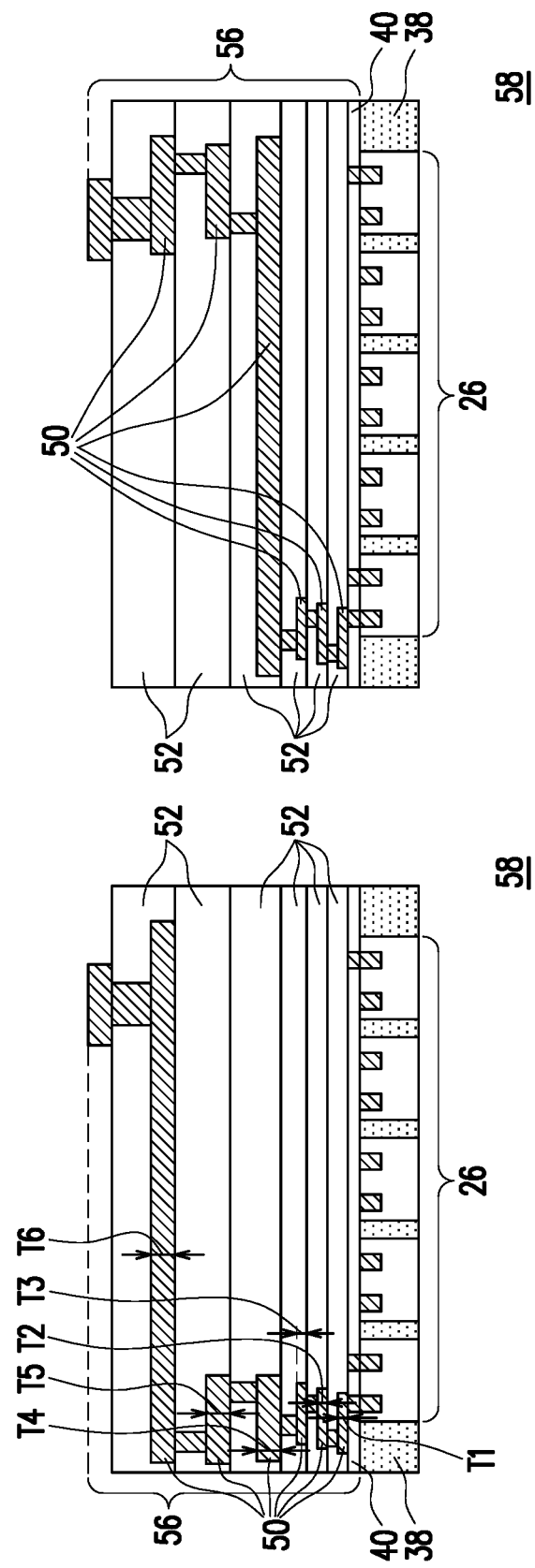

CROSS-WAFER RDLs IN CONSTRUCTED WAFERS

PRIORITY CLAIM AND CROSS-REFERENCE

This application is a continuation of U.S. patent application Ser. No. 17/660,501, entitled "Cross-Wafer RDLs in Constructed Wafers," and filed Apr. 25, 2022, which is a continuation of U.S. patent application Ser. No. 17/087,147, entitled "Cross-Wafer RDLs in Constructed Wafers," and filed Nov. 2, 2020, now U.S. Pat. No. 11,315,805, issued Apr. 26, 2022, which is a continuation of U.S. patent application Ser. No. 16/273,836, entitled "Cross-Wafer RDLs in Constructed Wafers," and filed Feb. 12, 2019, now U.S. Pat. No. 10,825,696, issued Nov. 3, 2020, which claims the benefit of U.S. Provisional Application No. 62/693,171, filed Jul. 2, 2018, and entitled "Cross-wafer RDLs in Packages," which applications are hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 26 through 33 illustrate the distribution of RDLs in different dielectric layers in reconstructed wafers in accordance with some embodiments.

DETAILED DESCRIPTION

Figure 1:
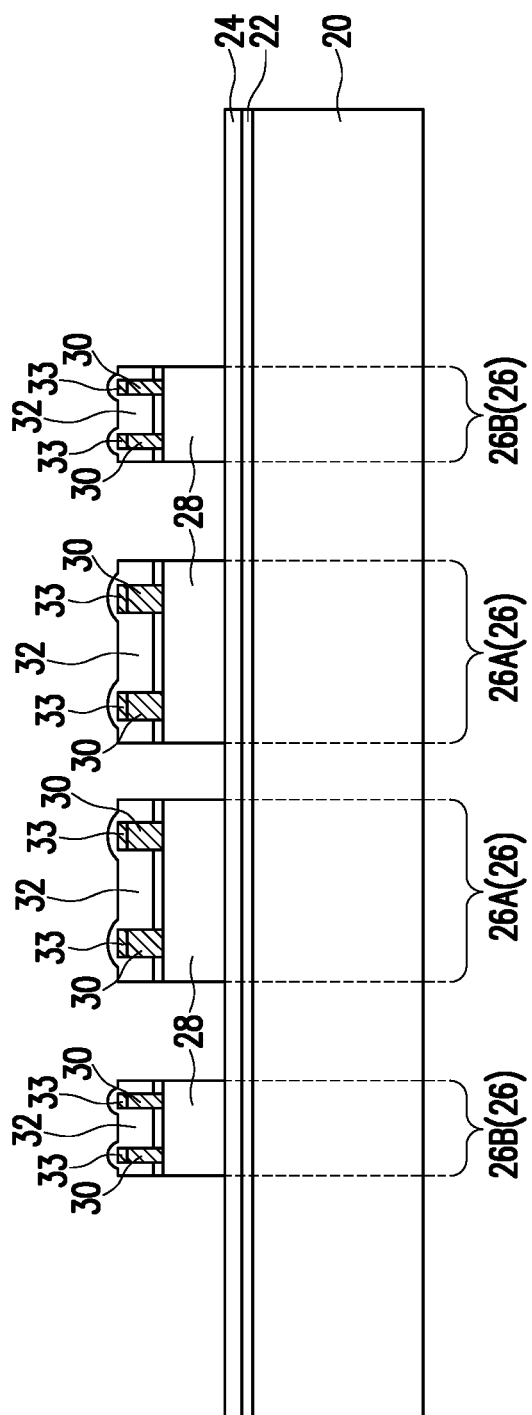
FIGS. 1 through 10 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with some embodiments. The intermediate stages of forming the package are illustrated in accordance with some embodiments. Some variations of some embodiments are discussed. Throughout the various views and illustrative embodiments, like reference numbers are used to designate like elements. In accordance with some embodiments of the present disclosure, cross-wafer RDLs are formed to connect the package components in reconstructed wafers directly, instead of going through device dies, repeaters, and/or solder regions.

Figure 35:
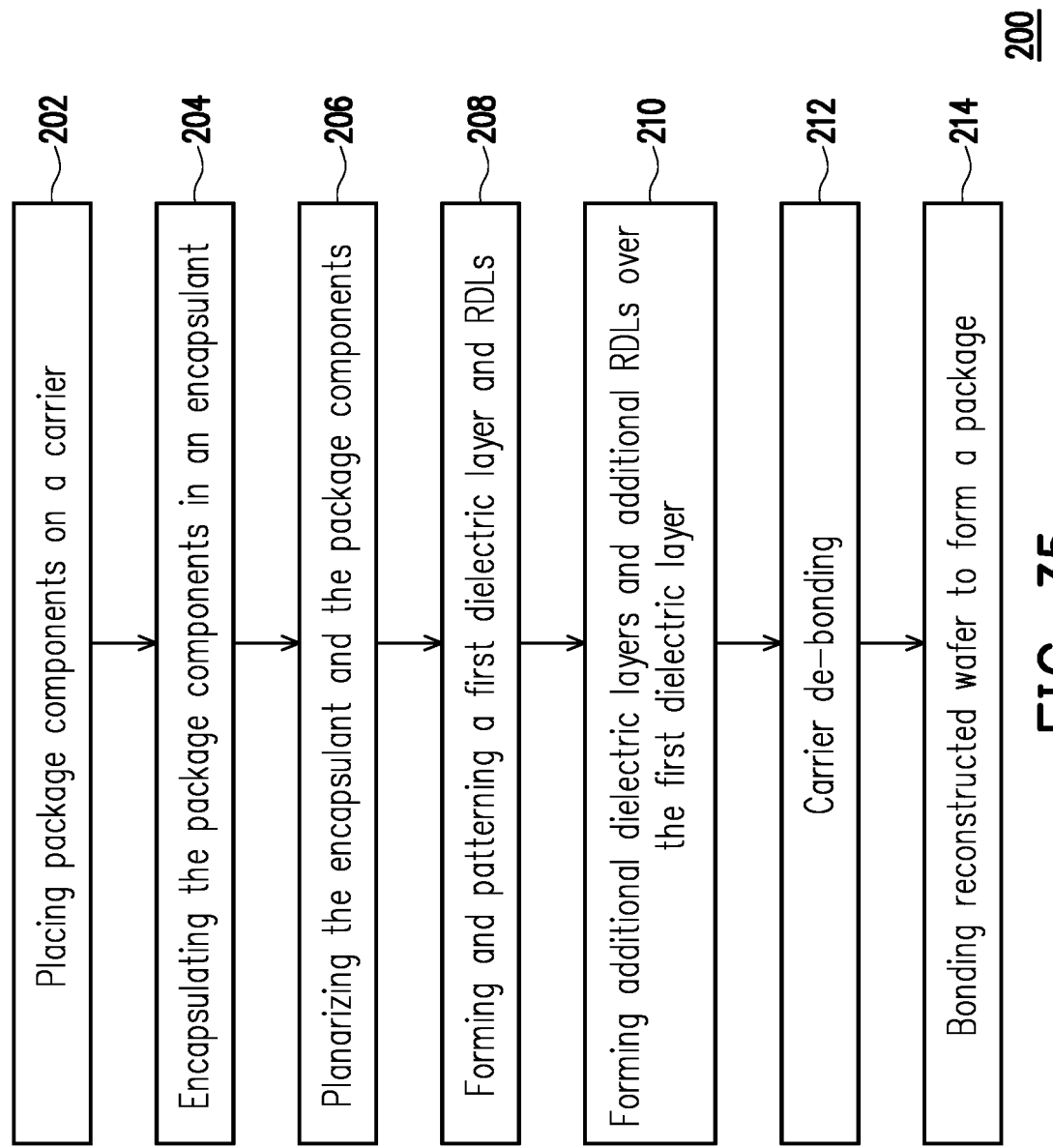
FIG. 35 illustrates a process flow for forming a package in accordance with some embodiments.

FIGS. 1 through 10 illustrate the cross-sectional views of intermediate stages in the formation of a package in accordance with some embodiments of the present disclosure. The processes shown in FIGS. 1 through 10 are also reflected schematically in the process flow 200 as shown in FIG. 35.

FIG. 1 illustrates carrier 20 and release film 22 formed over carrier 20. Carrier 20 may be a glass carrier, a ceramic carrier, or the like. Carrier 20 may have a round top-view shape, and may have a size of a silicon wafer. For example, carrier 20 may have an 8-inch diameter, a 12-inch diameter, or the like. Release film 22 may be formed of a polymer-based material (such as a Light-To-Heat-Conversion (LTHC) material), which may be removed along with carrier 20 from the overlying structures that will be formed in subsequent processes. In accordance with some embodiments of the present disclosure, release film 22 is formed of an epoxy-based thermal-release material. Die-Attach Film (DAF) 24 is formed over release film 22. DAF 24 is an adhesive film, and may be coated or laminated.

FIG. 1 further illustrates the placement of package components 26 (including 26A and 26B) over carrier 20. The respective process is illustrated as process 202 in the process flow shown in FIG. 35. In accordance with some embodiments of the present disclosure, package components 26 include logic dies (such as computing dies), memory dies (such as Dynamic Random Access Memory (DRAM) dies or Static Random Access Memory (SRAM) dies), photonic dies, packages (including device dies that have already been packaged), Input-output (IO) dies, digital dies, analog dies, surface-mount passive devices, die stacks such as High-Bandwidth Memory (HBM) blocks, or the like. Package components 26 may all be the same type of package components having an identical structure, or may include a plurality of different types of package components, which are illustrated as 26A and 26B as an example. In accordance with some embodiments, package components 26A are logic dies, while package components 26B are memory dies, IO dies, Integrated Passive Devices (IPDs) such as capacitors (multilayer ceramic capacitors (MLCCs), for example), resistors, inductors, or the like. Package components 26 may have areas in the range between about 20 mm$^2$ and about 900 mm$^2$. Some examples of the areas are in the range between about 100 mm$^2$ and about 400 mm$^2$.

In accordance with some embodiments of the present disclosure, package components 26 include semiconductor substrates 28, which may be silicon substrates, germanium substrates, or III-V compound semiconductor substrates formed of, for example, GaAs, InP, GaN, InGaAs, InAlAs, etc. Integrated circuit devices (not shown) such as transistors, diodes, resistors, capacitors, inductors, or the like, may be formed at the surfaces, or over, substrates 28. Interconnect structures such as metal lines and vias, which are formed in dielectric layers, are formed over and electrically coupling to the integrated circuit devices. Conductive pillars 30 are formed at the surfaces of the corresponding package components 26, and are electrically coupling to the integrated circuit devices in package components 26 through the interconnect structures. In accordance with some embodiments of the present disclosure, soft conductive materials such as solder, aluminum, or the like, are used to form conductive layers 33 on conductive pillars 30. Conductive layers 33 are used for probing package components 26 to ensure that package components 26 are not defective. The probing may be performed before package components 26 are singulated from the respective wafer. With conductive layers 33 being softer than the underlying metal pillars 30, the probing is easier due to the improved contact between the probing card of the probing device and conductive layers 33. Dielectric layers 32 are formed to cover conductive layers 33 and metal pillars 30. Dielectric layers 32 may be formed of a polymer such as polyimide, polybenzoxazole (PBO), or the like.

Figure 2:
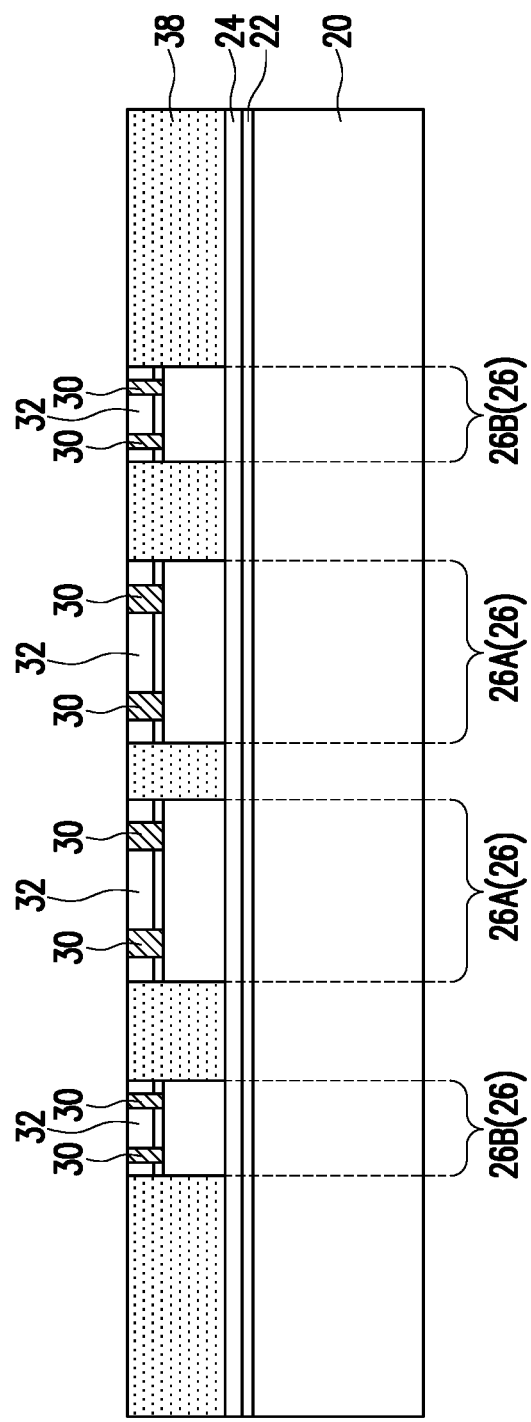

Next, referring to FIG. 2, encapsulant 38 is encapsulated (sometimes referred to as molded) on package components 26. The respective process is illustrated as process 204 in the process flow shown in FIG. 35. Encapsulant 38 fills the gaps between neighboring package components 26, and further covers package components 26. Encapsulant 38 may include a molding compound, a molding underfill, or the like. Encapsulant 38 may include a base material, which may be a polymer, an epoxy, and/or a resin, and filler particles mixed in the base material. The filler particles may be formed of silica, aluminum oxide, or the like, and may have spherical shapes.

In a subsequent step, as also shown in FIG. 2, a planarization process such as a Chemical Mechanical Polish (CMP) process or a mechanical grinding process is performed. The respective process is illustrated as process 206 in the process flow shown in FIG. 35. The top surface of encapsulant 38 is lowered by the planarization, until metal pillars 30 are exposed. Due to the planarization, the top surfaces of metal pillars 30 are substantially coplanar with the top surface of encapsulant 38. Conductive layers 33 (FIG. 1) may be removed in the planarization process, or some bottom portions of conductive layers 33 may be left covering metal pillars 30.

Figure 3:
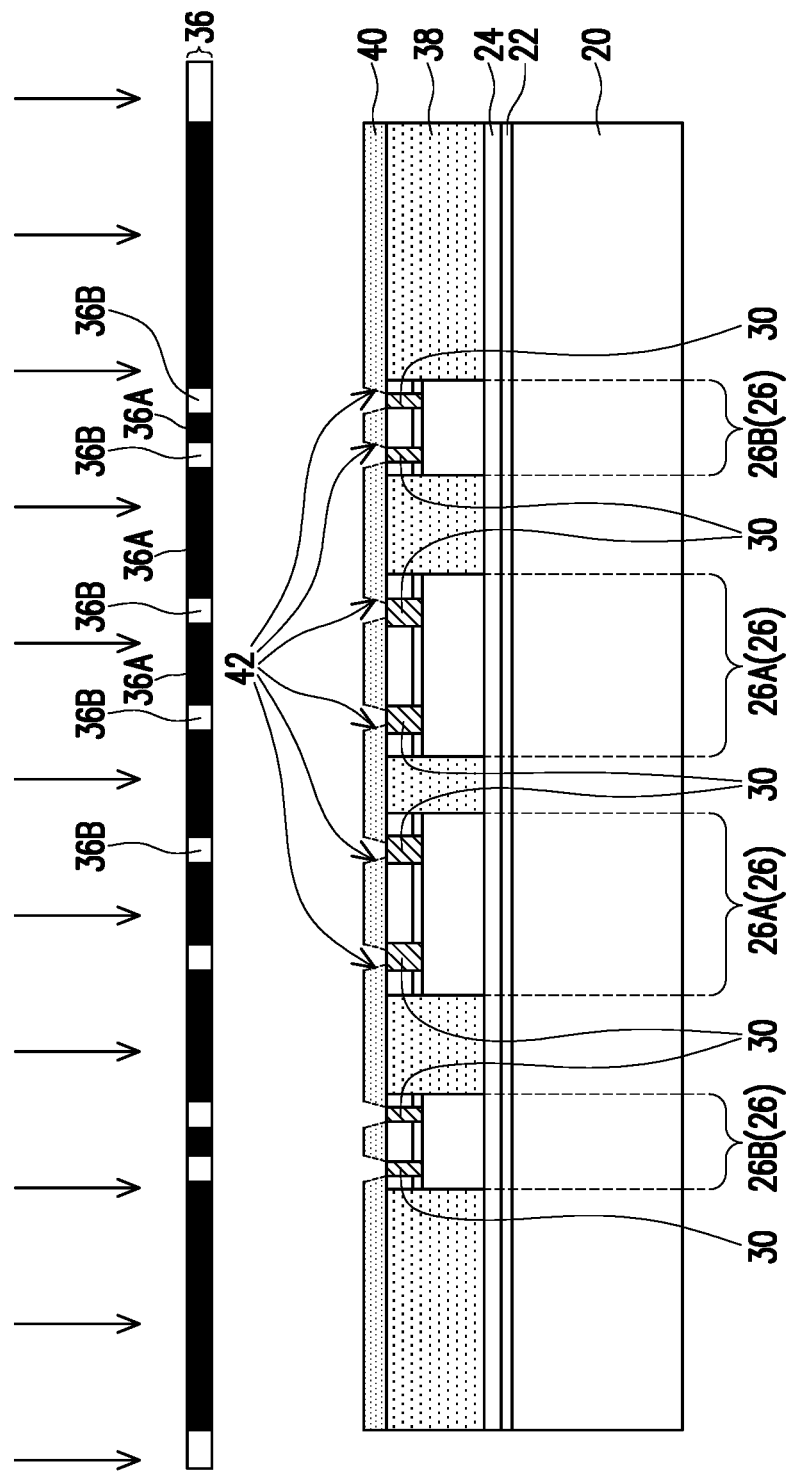

FIGS. 3 through 8 illustrate the formation of front-side Redistribution Lines (RDLs) and the respective dielectric layers. Referring to FIG. 3, dielectric layer 40 is formed. The respective process is illustrated as process 208 in the process flow shown in FIG. 35. In accordance with some embodiments of the present disclosure, dielectric layer 40 is formed of a light-sensitive polymer such as PBO, polyimide, or the like. In accordance with alternative embodiments of the present disclosure, dielectric layer 40 is formed of an inorganic material such as silicon nitride, silicon oxide, or the like.

Dielectric layer 40 is patterned, for example, using a photo lithography process, so that openings 42 are formed. Lithography mask 36, which includes opaque portions 36A and transparent portions 36B, are used to light-expose dielectric layer 40 when dielectric layer 40 is formed of a light-sensitive material. The light-exposed dielectric layer 40 is then developed to form openings 42. The edges of openings 42 are drawn as dashed since openings 42 have not been formed when dielectric layer 40 is light-exposed. Rather, openings 42 are formed when dielectric layer 40 is developed. In accordance with alternative embodiments in which dielectric layer 40 is a non-light-sensitive material, a photo resist (not shown) is coated on dielectric layer 40, and the photo resist is exposed using lithography mask 36 and then developed, and dielectric layer 40 is etched using the patterned photo resist as an etching mask to form openings 42. Metal pillars 30 of package components 26 are revealed through openings 42.

Figure 4:
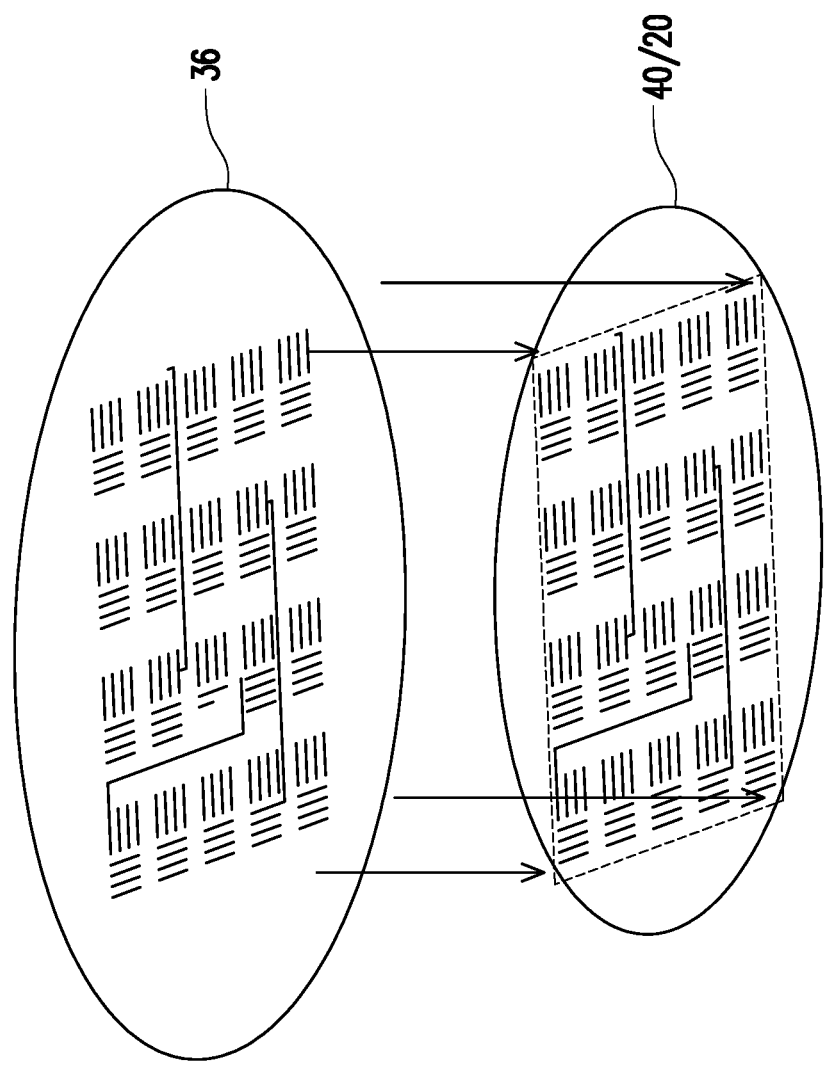

In accordance with some embodiments, the lithography mask 36 has a wafer size that is substantially equal to or greater than the size of carrier 20. For example, FIG. 4 illustrates dielectric layer 40 and the corresponding lithography mask 36 and carrier 20. In accordance with some embodiments, carrier 20 and the overlying dielectric layer 40 have rounded top-view shapes, and lithography mask 36 may also have a rounded top-view shape. In accordance with alternative embodiments, carrier 20 and the overlying dielectric layer 40 have rectangular shapes, and lithography mask 36 may also have a rectangular top-view shape. The light exposure is also performed at wafer level, which means that all patterns (such as openings 42) at the same level are exposed in the same exposure process. This is different from conventional light-exposure process, in which the corresponding lithography masks were smaller than the corresponding wafers. The area of a conventional wafer was divided into sub regions, each being exposed by a light-exposure process. For example, in a first light-exposure process, a lithography mask is directly over a first sub region, and the first sub region is exposed. The lithography mask is then moved to be directly over a second sub region, and the second sub region is exposed. The process is repeated until all of the sub regions are exposed, and then a development step is performed. The conventional exposure has a problem. In the resulting package, the features in one sub region have to be identical to the features in other sub regions. If a feature such as an RDL extends beyond the size of the lithography mask, then it is difficult to form such a feature. In accordance with some embodiments of the present disclosure, the size of the lithography mask is able to cover the entire wafer/carrier, and hence a feature such as an RDL can have a cross-wafer length.

Figure 5:
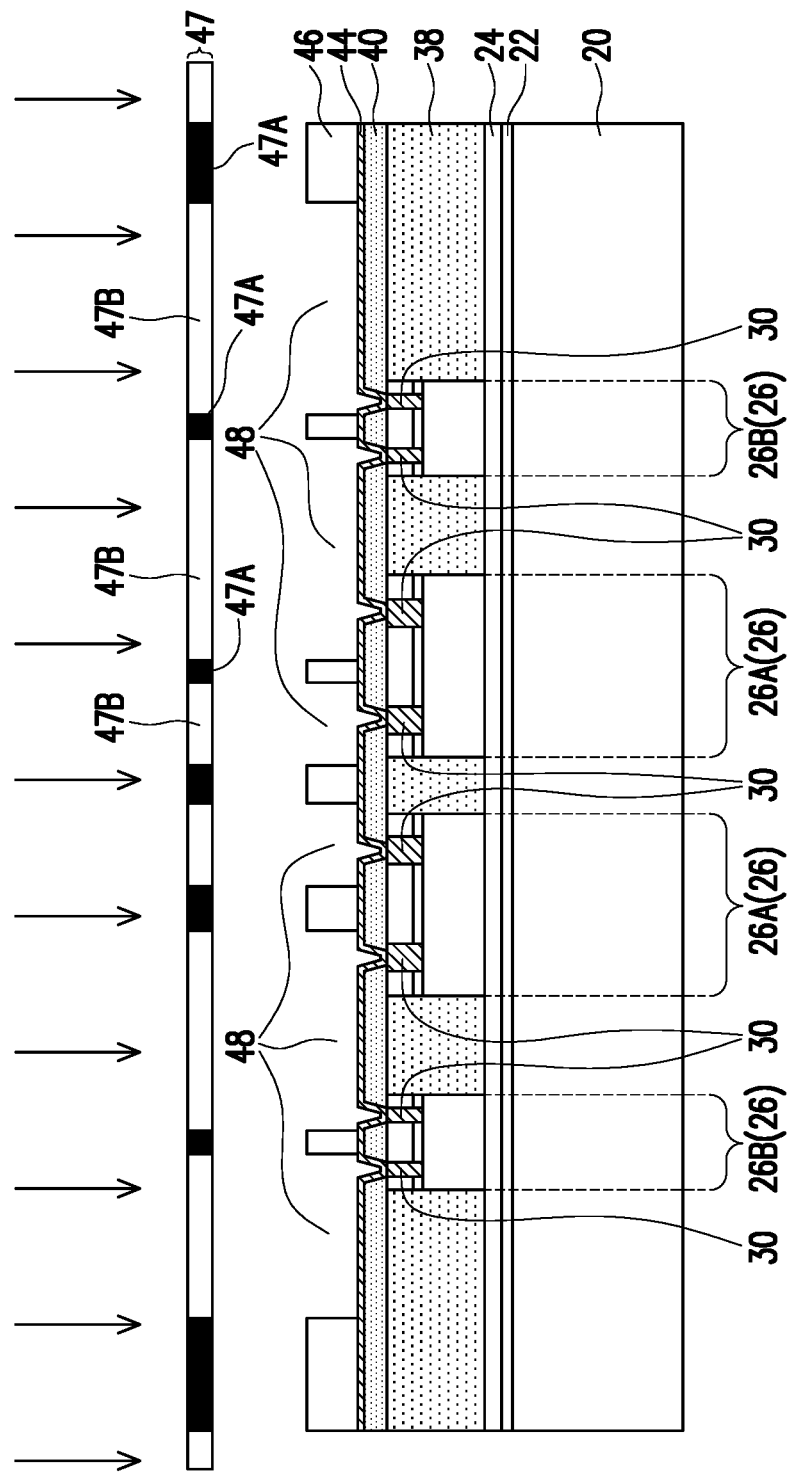

RDLs are then formed to electrically connect to metal pillars 30. The respective process is illustrated as process 208 in the process flow shown in FIG. 35. In accordance with some embodiments of the present disclosure, as shown in FIG. 5, a blanket metal seed layer 44 is formed, which includes some portions extending into openings 42, and some other portions over dielectric layer 40. Metal seed layer 44 may be formed of titanium, copper, nickel, or the like. In accordance with some embodiments of the present disclosure, metal seed layer 44 includes a titanium layer and a copper layer over the titanium layer. Plating mask 46 is then formed over metal seed layer 44, and is then patterned to form openings 48, so that some portions of metal seed layer 44 are revealed. Furthermore, openings 42 are also spatially joined to openings 48.

In accordance with some embodiments, the formation of plating mask 46 is performed at wafer level, and hence the entire plating mask 46 is light-exposed in the same light-exposure process. Wafer-level lithography mask 47, which is large enough to include all of the patterns (such as openings 48) to be formed in plating mask 46, is used to expose plating mask 46. Lithography mask 47 includes opaque portions 47A and transparent portions 47B, and may also have a round top-view shape or a rectangular top-view shape. The corresponding light-exposure process is also similar to what is shown in FIG. 4.

Figure 6:
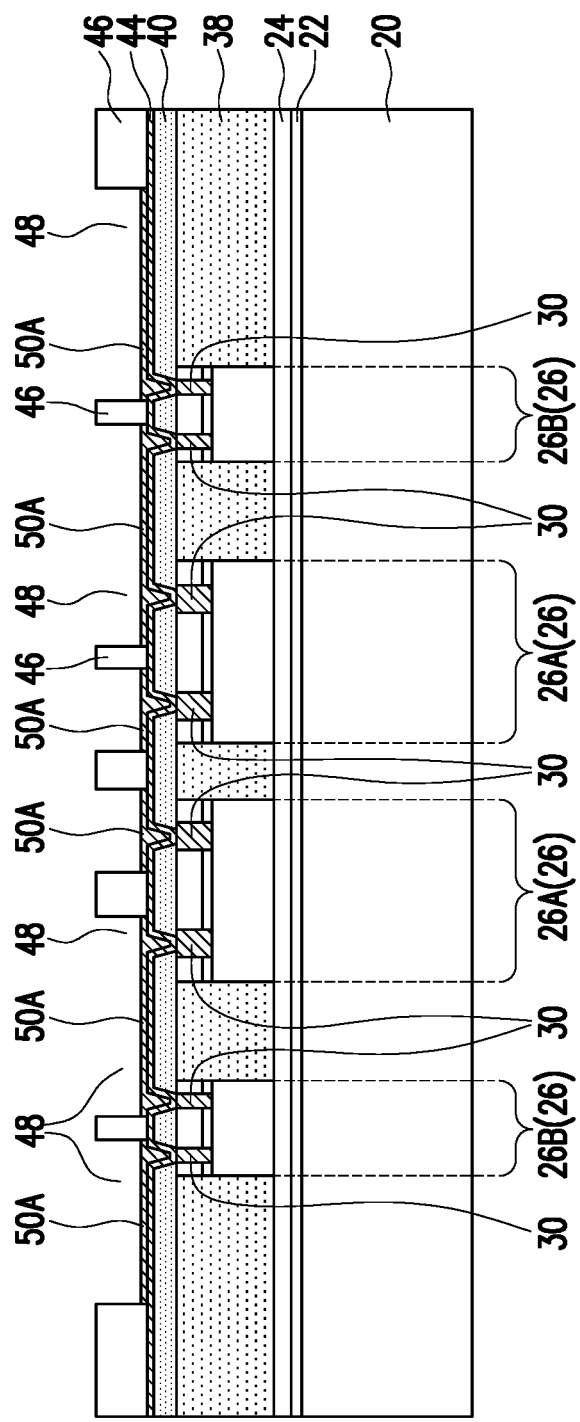

Referring to FIG. 6, a plating process is performed to form RDLs 50A. The plating process may include electro-chemical plating, electro-less plating, or the like. The plated material may include a metal or a metal alloy including titanium, copper, nickel, aluminum, tungsten, multi-layers thereof, and/or alloys thereof.

Figure 7:
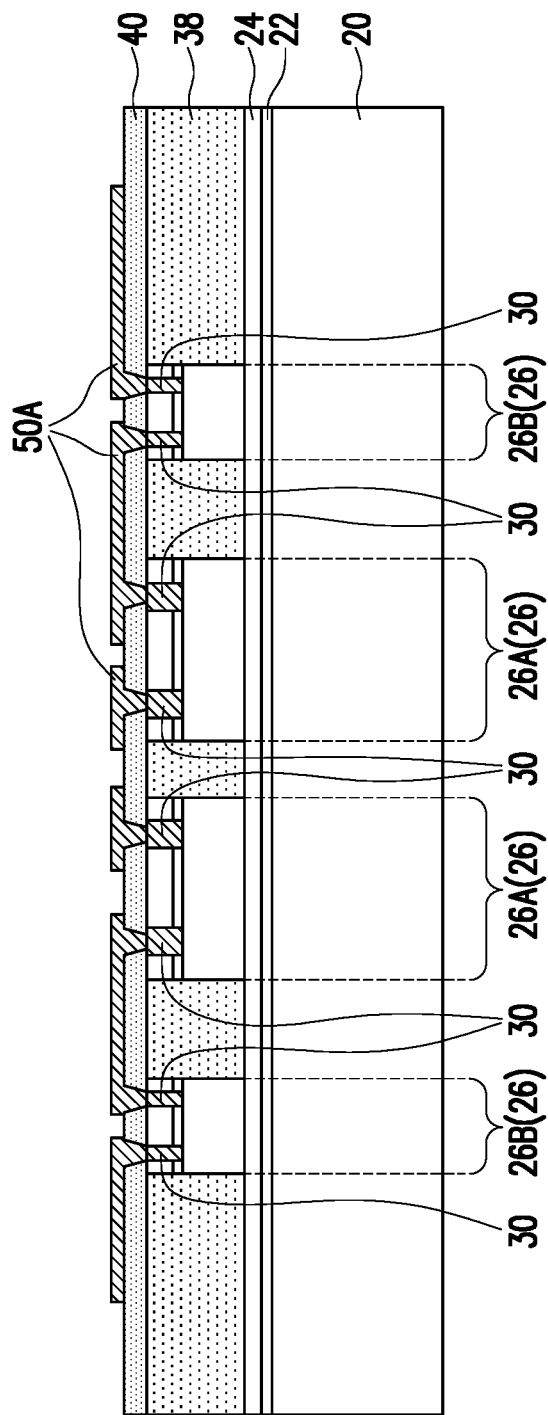

In a subsequent process, plating mask 46 is removed, for example, in an ashing process. The portions of the blanket metal seed layer 44 previously covered by plating mask 46 are then etched. The resulting structure is shown in FIG. 7. The remaining portions of metal seed layer 44 are considered as parts of RDLs 50A. RDLs 50A include the via portions in dielectric layer 40, and trace (line) portions over dielectric layer 40. The trace portions may include narrow portions and wide portions, wherein the wide portions may act as metal pads.

Figure 8:
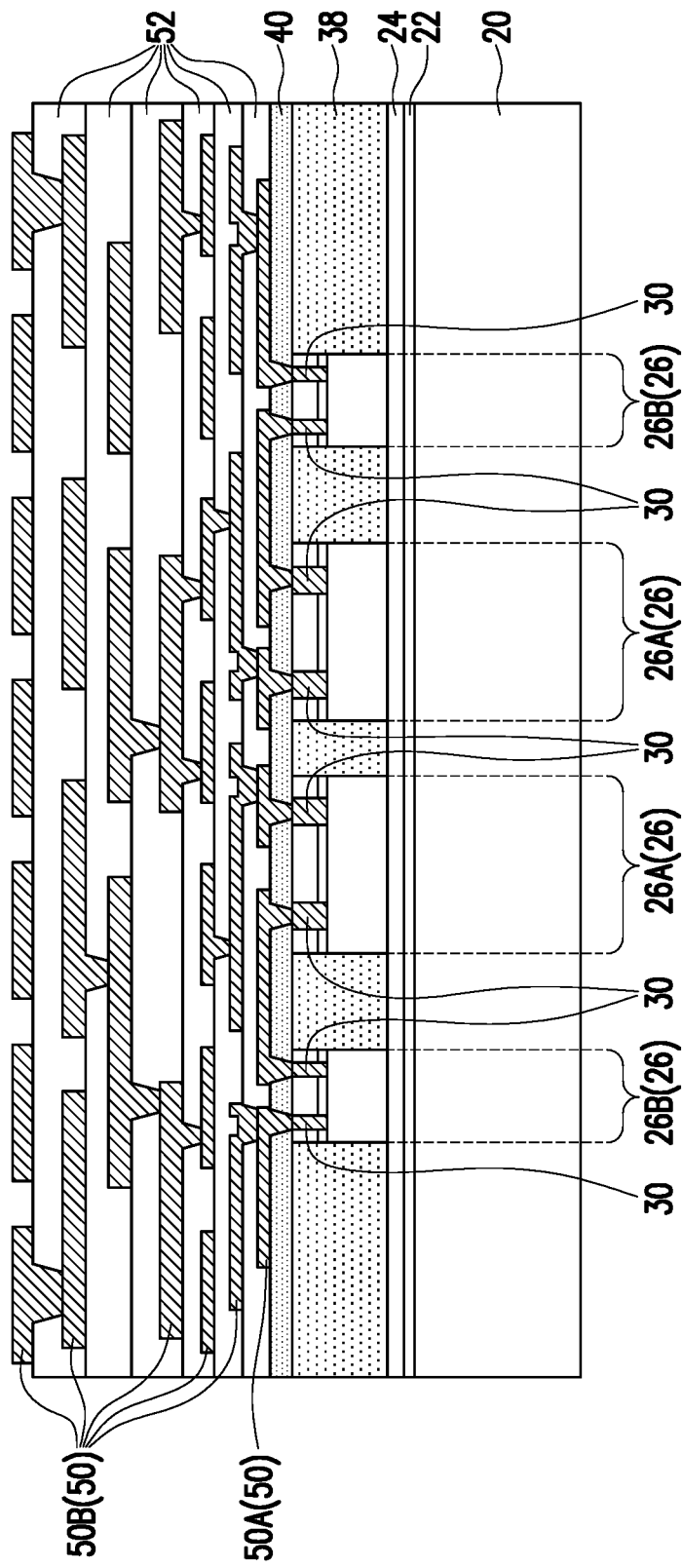

Referring to FIG. 8, in accordance with some embodiments of the present disclosure, additional dielectric layers and the corresponding layers of RDLs are formed. The respective process is illustrated as process 210 in the process flow shown in FIG. 35. It is appreciated that depending on the design requirement, the numbers of dielectric layers and RDL layers may be more or fewer than what are illustrated. In accordance with some embodiments of the present disclosure, dielectric layers 52 are formed using the materials selected from the similar group of candidate materials for forming dielectric layer 40. RDLs 50B are formed to extend into dielectric layers 52 and electrically couple to package components 26. RDLs 50B may be formed using similar materials and methods for forming RDLs SA. Dielectric layers 40 and 52 and RDLs 50A and 50B in combination form interconnect structure 56, which may electrically interconnect all of the package components 26 in encapsulant 38 as an integrated system. RDLs 50A and 50B are in combination referred to as RDLs 50 hereinafter. In the formation of RDLs 50B, the lithography mask that are large enough to cover the entire carrier 20 may be used, so that all of the RDLs 50B at the same level can be formed in a same lithography process.

Figure 9:
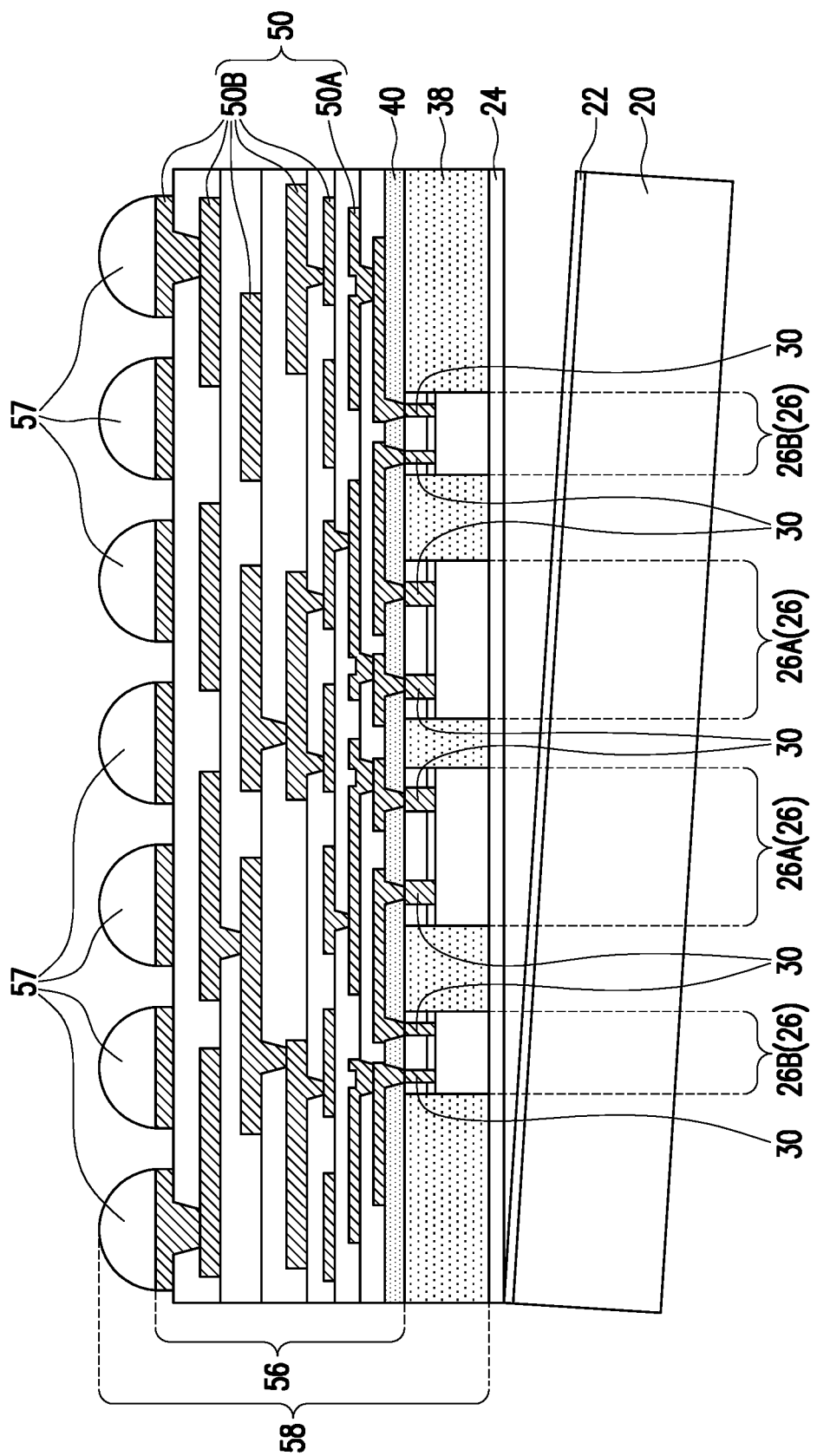

FIG. 9 illustrates the formation of electrical connectors 57. In accordance with some embodiments of the present disclosure, electrical connectors 57 are solder regions. In accordance with alternative embodiments, electrical connectors 57 include metal pillars and solder regions over the metal pillars. The formation of electrical connectors 57 may include placing solder balls on the exposed portions of the RDL pads in the top RDL layer, and then reflowing the solder balls to form solder regions. In accordance with alternative embodiments of the present disclosure, the formation of electrical connectors 57 includes performing plating steps to form metal pillars and solder regions over the metal pillars, and then reflowing the plated solder regions. Throughout the description, the features over DAF 24 are in combination referred to as package component 58, which may be reconstructed wafer 58.

In accordance with other embodiments, package component 58 may be a reconstructed panel, reconstructed substrate, or the like. For example, in the plane view of package component 58, package component 58 may have a circular shape, a rectangular shape, or the like. The package components 26 may be arranged as an array in the reconstructed panel or the reconstructed substrate.

In a subsequent process, as also shown in FIG. 9, reconstructed wafer 58 is demounted (de-bonded) from carrier 20, for example, by projecting a light on release film 22, and the light (such a laser beam) penetrates through the transparent carrier 20. The respective process is illustrated as process 212 in the process flow shown in FIG. 35. The release film 22 is thus decomposed, and reconstructed wafer 58 is released from carrier 20. DAF 24 may be removed in a cleaning process or a backside grinding process. The reconstructed wafer 58 is thus formed.

Figure 10:
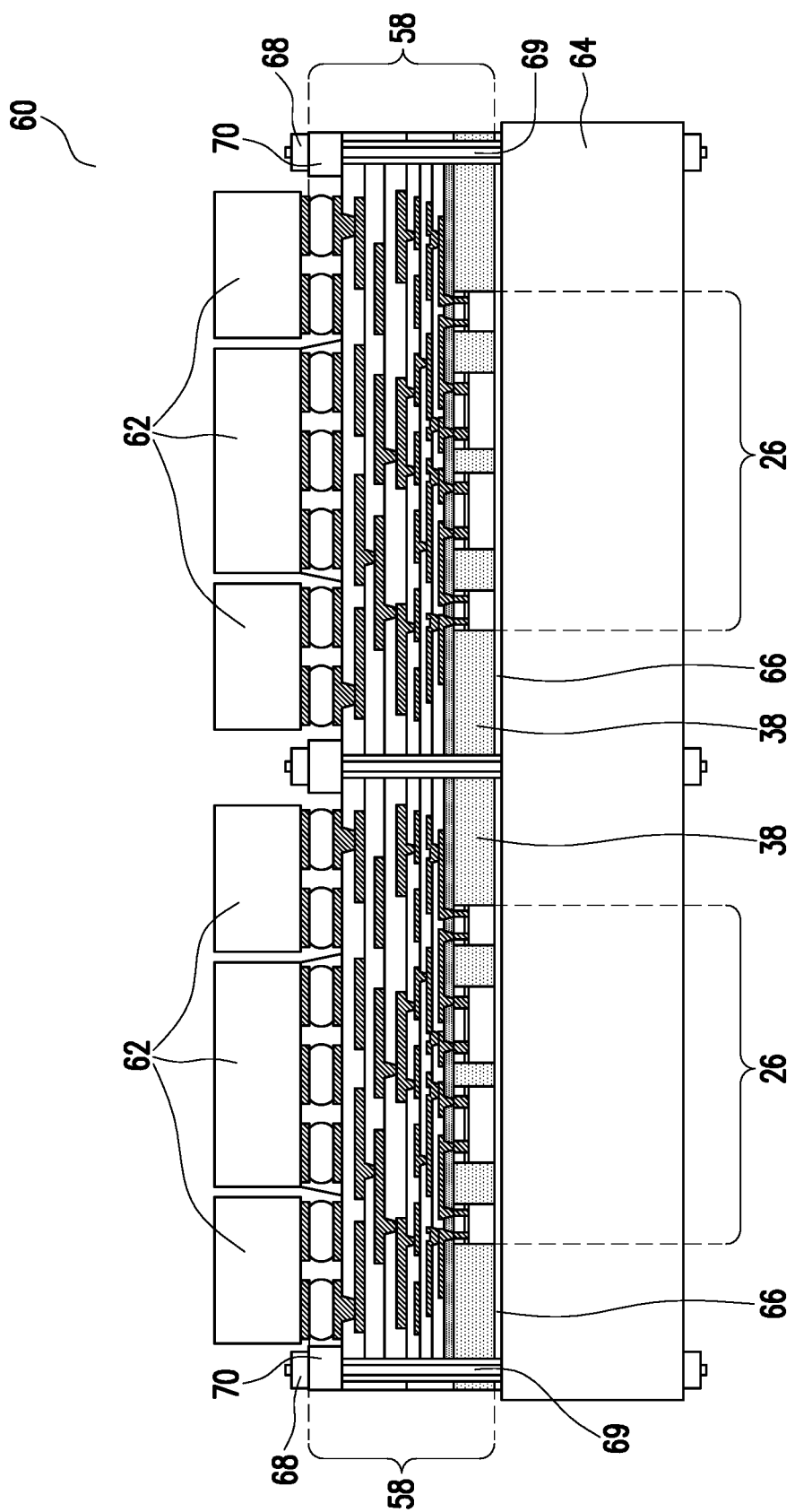

FIG. 10 illustrates the formation of package 60, in which reconstructed wafer 58 is incorporated. The respective process is illustrated as process 214 in the process flow shown in FIG. 35. In accordance with some embodiments of the present disclosure, the reconstructed wafer 58 that is de-bonded from carrier 20 is used in package 60 without being sawed, and all package components 26 as in FIG. 9 remain in package 60. Reconstructed wafer 58 may also be trimmed, for example, by removing some outer portions that are free from package components 26 and RDLs 50, or may not be trimmed. FIG. 10 illustrates that package 60 includes two reconstructed wafers 58 as an example. It is appreciated that a package may include one or more than two reconstructed wafers. Furthermore, when having more than one reconstructed wafer 58, the reconstructed wafers 58 may have an identical structure or different structures.

In accordance with some embodiments of the present disclosure, a plurality of package components 62, which include, and are not limited to, packages, voltage regulator module, power supply module, IPDs, IO connectors (such as sockets, which are used for the IO of package 60), or the like are bonded or attached to reconstructed wafers 58. Reconstructed wafers 58 may be attached to thermal module 64 through Thermal Interface Material (TIM) 66. Screws 68, bolts 69, and stiffeners/braces 70 may be used to secure reconstructed wafer 58 onto thermal module 64. Holes may be drilled in reconstructed wafers 58 and thermal module 64, so that bolts 69 may penetrate through reconstructed wafers 58 and thermal module 64. Thermal module 64 may include a heat sink, a heat spreader, a cold plate, or the like. When a cold plate is used, the corresponding coolant therein may be a gas or a liquid such as water, oil, or the like.

Figure 11:
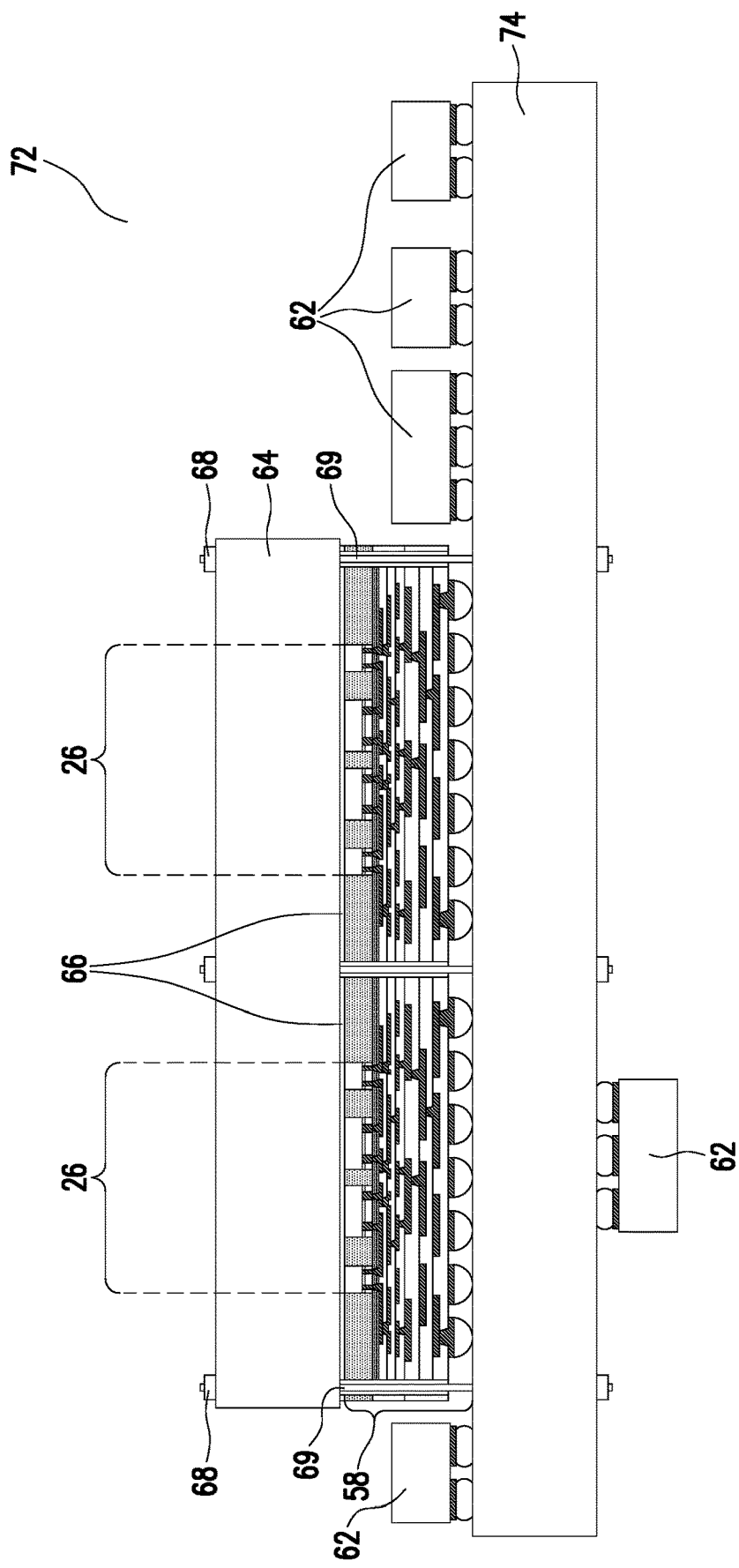
FIG. 11 illustrates a cross-sectional view of a package in accordance with some embodiments.

FIG. 11 illustrates the formation of package 72, in which a reconstructed wafer 58 is incorporated. In accordance with some embodiments of the present disclosure, reconstructed wafer 58 is bonded with package component 74 through flip-chip bonding. Package component 74 may be a package substrate, an interposer, a printed circuit board, or the like. Package components 62 may be bonded to package component 74. Thermal module 64, reconstructed wafer 58, and package component 74 may be secured together by screws 68 and bolts 69.

The packages 60 (FIG. 10) and 72 (FIG. 11) may be High-Performance Computing (HPC) packages, the accelerators of Artificial Intelligence (AI) servers, other performance-demanding computing packages used for data center applications, or packages for some servers.

Figure 13:
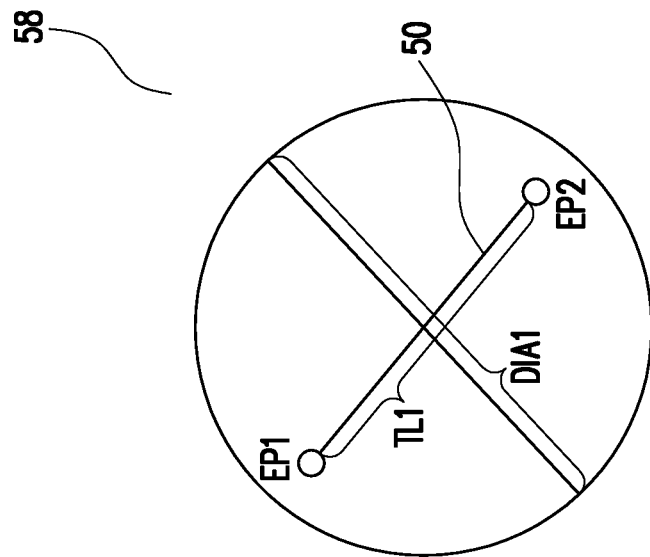
FIGS. 12 and 13 illustrate the top views of tracing lengths of Redistribution Lines (RDLs) in reconstructed wafers in accordance with some embodiments.
Figure 12:
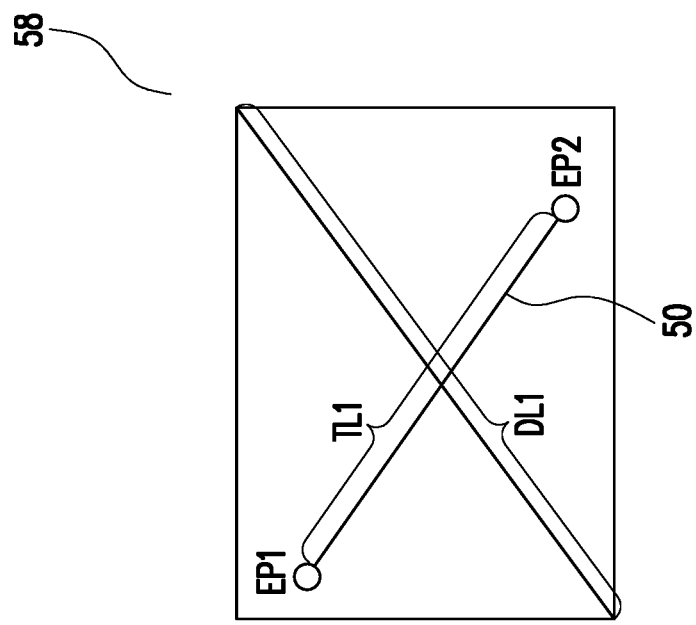
Figure 15:
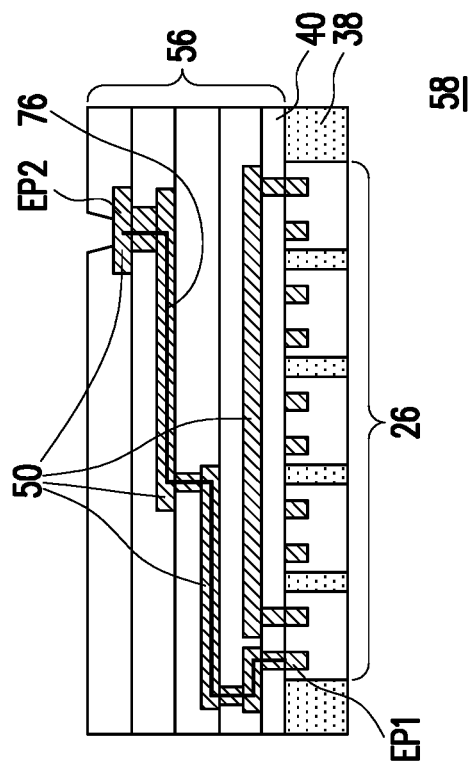
FIGS. 14 and 15 illustrate the cross-sectional views of tracing lengths of RDLs in reconstructed wafers in accordance with some embodiments.
Figure 14:
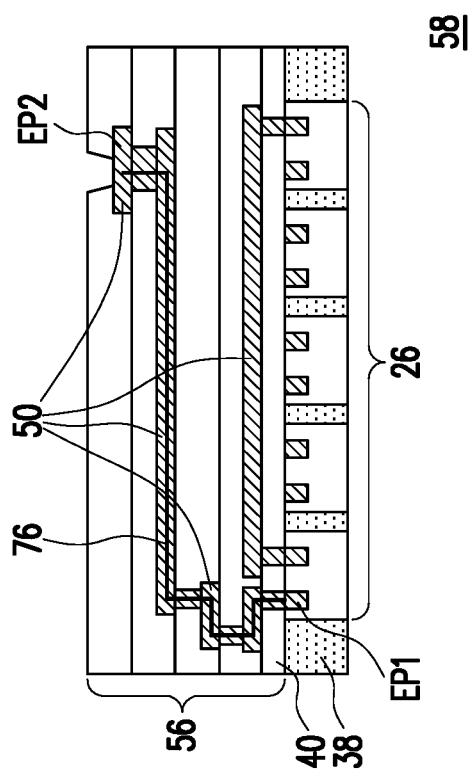

The details in the placement of package components 26 (as discussed in the preceding embodiments) are discussed referring to FIGS. 11 through 23. Reconstructed wafers 58 in accordance with these embodiments may be large wafers, which may have areas greater than about 10,000 mm$^2$, which areas may also be in the range between about 10,000 mm$^2$ and about 70,686 mm$^2$. FIGS. 12 and 13 illustrate the cross-wafer RDLs 50 in reconstructed wafers 58 in accordance with some embodiments. A connection line, which may include one or a plurality of RDLs 50, has end points EP1 and EP2. Throughout the description, the RDLs 50 that interconnects end points EP1 and EP2 is collectively referred to as a cross-wafer RDL, and is also referred to using reference numeral 50 since cross-wafer RDL is the collection of RDLs 50. The end points EP1 and EP2 may be the conductive pads (or pillars) of package components 26 or the conductive pads to external connections such as electrical connectors 57 (FIG. 9). The tracing length of cross-wafer RDL 50, which interconnects end points EP1 and EP2, is TL1. The tracing length is the total length when tracing the route between end points EP1 and EP2. For example, FIGS. 14 and 15 illustrate the cross-wafer RDLs connected between end points EP1 and EP2. The cross-wafer RDLs 50 may include a plurality of (such as four as illustrated) layers of RDLs (including traces and vias), and the total length of a tracing line (marked as 76) is the tracing length TL1 as in FIGS. 12 and 13). Alternatively stated, the tracing length TL is the length of a route flowed through by a current flowing between end points EP1 and EP2. FIG. 15 illustrates an embodiment in which two of the RDL traces are long traces, as compared to in FIG. 14, in which one of the RDL traces is a long trace.

Referring back to FIG. 12, reconstructed wafer 58 has a rectangular top-view shape, and the diagonal length of reconstructed wafer 58 is DL. In accordance with some embodiments, reconstructed wafer 58 has a rectangular top-view shape, and a cross-wafer RDL 50 has ratio TL1/DL1 greater than about 0.25, and may be in the range between about 0.25 and about 1.0, wherein TL1 is the tracing length interconnecting end points EP1 and EP2, and DL is the diagonal length of reconstructed wafer 58. In accordance with some embodiments, reconstructed wafer 58 has a round top-view shape as shown in FIG. 13, and a cross-wafer RDL 50 has ratio TL1/DIA1 greater than about 0.25, and may be in the range between about 0.25 and about 1.0, wherein TL1 is the tracing length of the cross-wafer RDL 50 interconnecting end points EP1 and EP2, and DL is the diameter of reconstructed wafer 58.

In accordance with some embodiments, reconstructed wafer 58 has an area greater than about 10,000 mm$^2$. The tracing length of a cross-wafer RDL may be greater than about 26 mm, which is the maximum length that may be reached (with difficulty) by using conventional lithography mask. The tracing length may be in the range between about 26 mm and about 100 mm. A cross-wafer RDL 50 may also have a length greater than about 1.5 times an edge length SDL of a package component 26, for example, as shown in FIG. 16.

Figure 17:
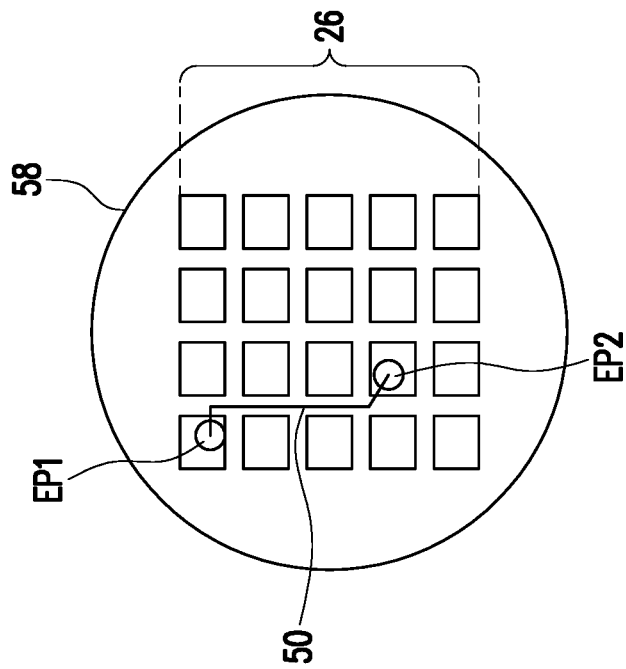
FIGS. 16 through 21 are top views of some RDLs in reconstructed wafers in accordance with some embodiments.
Figure 16:
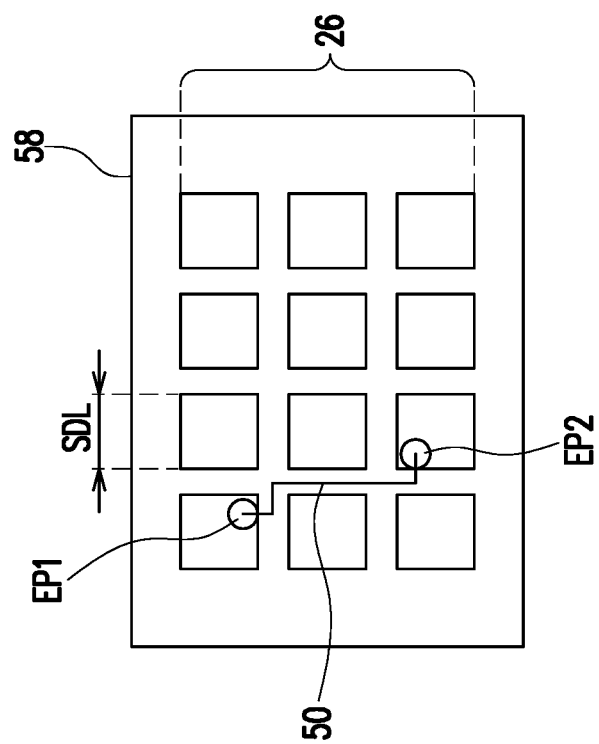

FIGS. 16 through 21 illustrate package components 26 in reconstructed wafers 58 and some examples of cross-wafer RDLs 50 in accordance with some embodiments. Referring to FIG. 16, reconstructed wafer 58 has a rectangular top-view shape. Package components 26 are laid out as an array. Cross-wafer RDL 50 connects the package component 26 in a first row to a package component 26 in a last row. The cross-wafer RDL 50 is routed through the space (in the top view) between package components 26. FIG. 17 illustrates reconstructed wafer 58 has a round top-view shape, and cross-wafer RDL 50 passes through the space between a plurality of package components 26.

Figure 19:
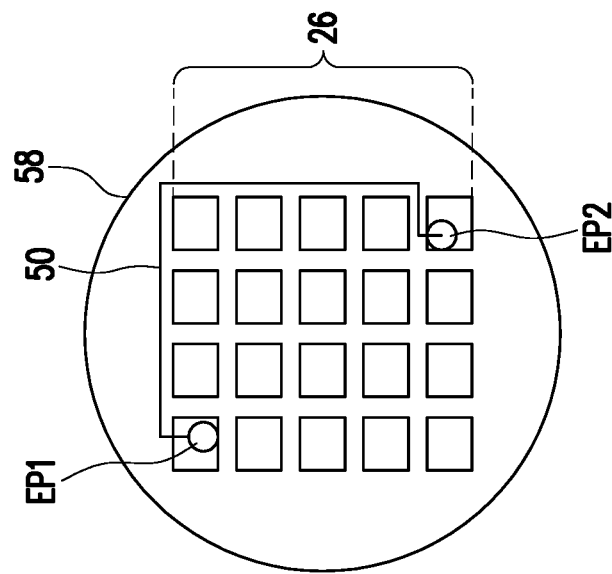
Figure 18:
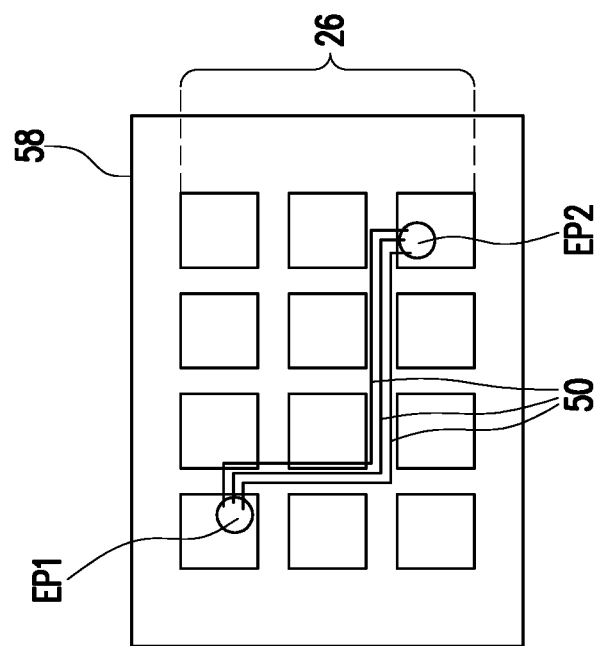

Referring to FIG. 18, reconstructed wafer 58 has a rectangular top-view shape, and package components 26 are laid out as an array. There may be a plurality of cross-wafer RDLs 50 connecting the same two package components 26. The plurality of cross-wafer RDLs 50 may be parallel to each other, and are routed through the same space between two neighboring rows and/or columns of package components 26. FIG. 19 illustrates reconstructed wafer 58 having a round top-view shape, in which a cross-wafer RDL 50 routes through the outer side of the array of package components 26. The cross-wafer RDL 50 may also connect two package components 26 that are substantially on opposite ends of the same diameter.

Figure 21:
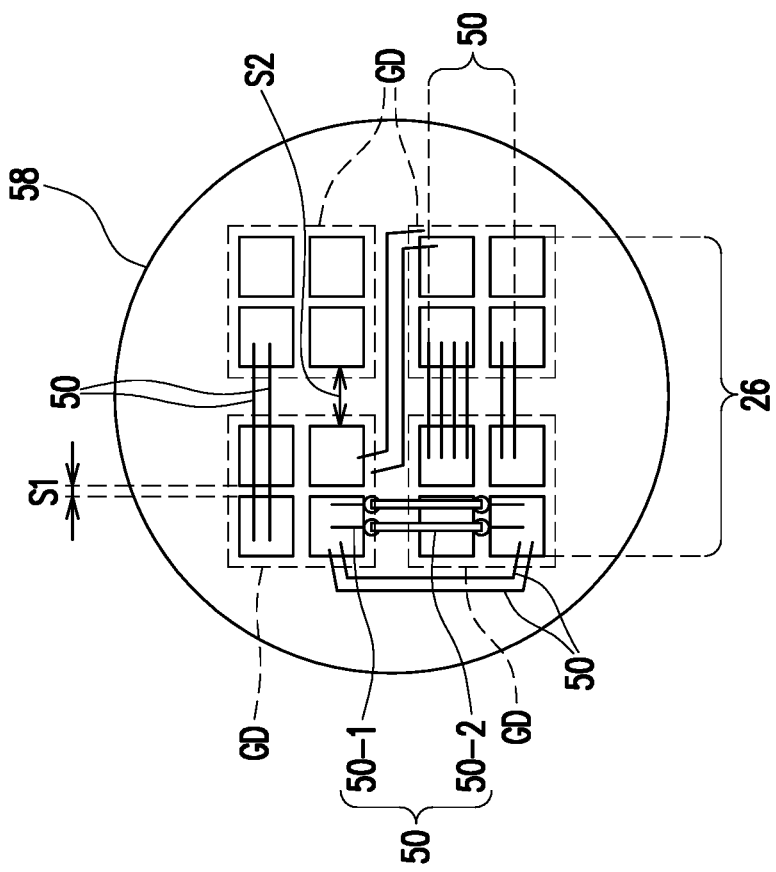
Figure 20:
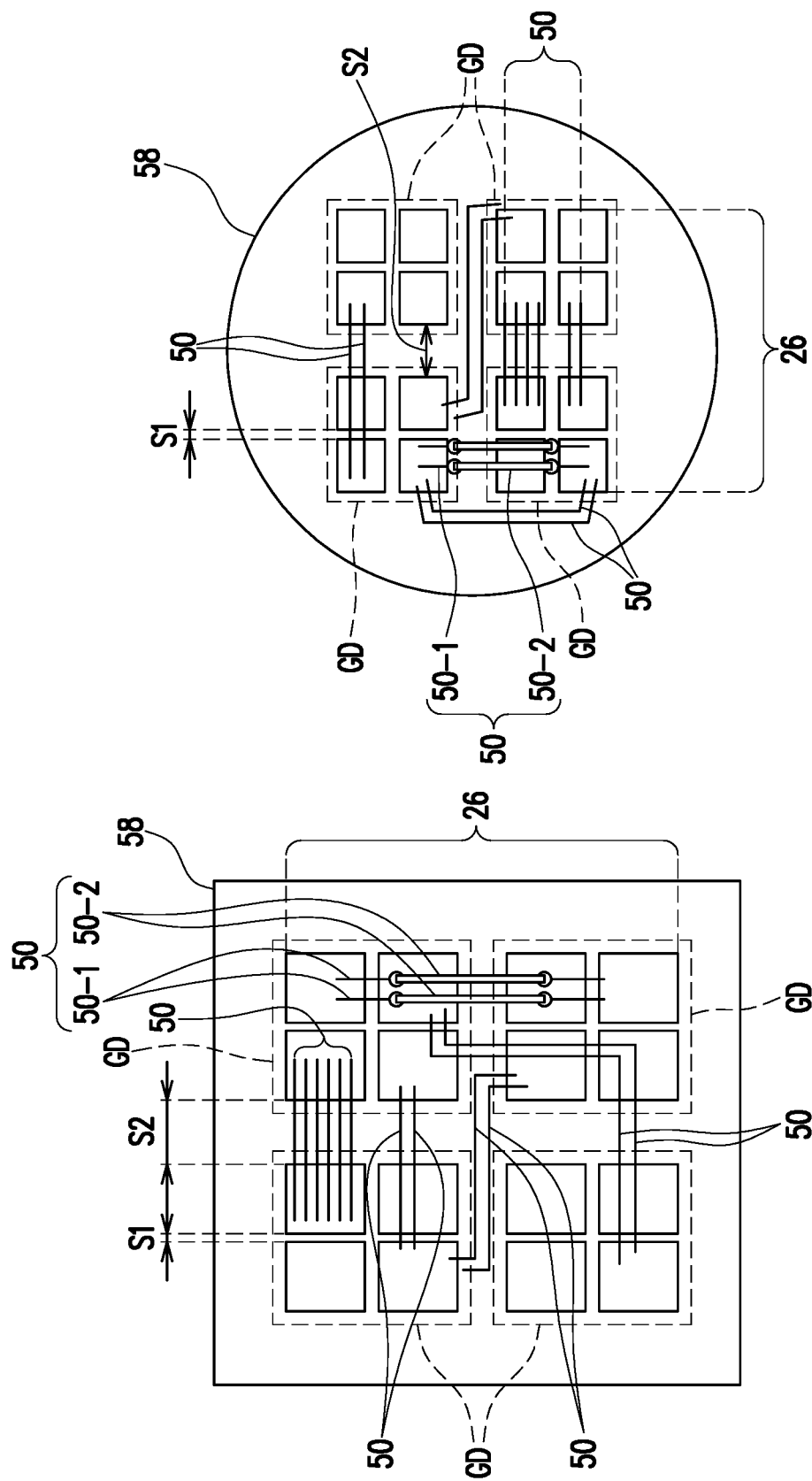

FIGS. 20 through 25 illustrate package components 26 disposed as groups GD. The groups GD may have structures identical to each other. Each of the groups GD may include a single type of package components such as computing dies, or may include a plurality of package components such as logic/computing dies, memory dies, passive devices, IO dies, and/or the like. The inner-group spacing between the package components 26 in the same group may be equal to or smaller than the inter-group spacing between groups. For example, FIGS. 20 and 21 illustrate that inner-group spacing S1 is smaller than inter-group spacing S2. In accordance with some embodiments, cross-wafer RDLs 50 may be routed with a plurality of configurations. For example, some of cross-wafer RDLs 50 may cross over some package components, while some other cross-wafer RDLs 50 may not cross-over any package component 26 (except the package components the cross-wafer RDLs 50 are connected to). Some of cross-wafer RDLs 50 may include portions in different dielectric layers. For example, cross-wafer RDLs 50-1 and 50-2 may be in different dielectric layers. In FIG. 20, reconstructed wafer 58 has a rectangular top-view shape, and in FIG. 21, reconstructed wafer 58 has a rounded top-view shape.

Figure 23:
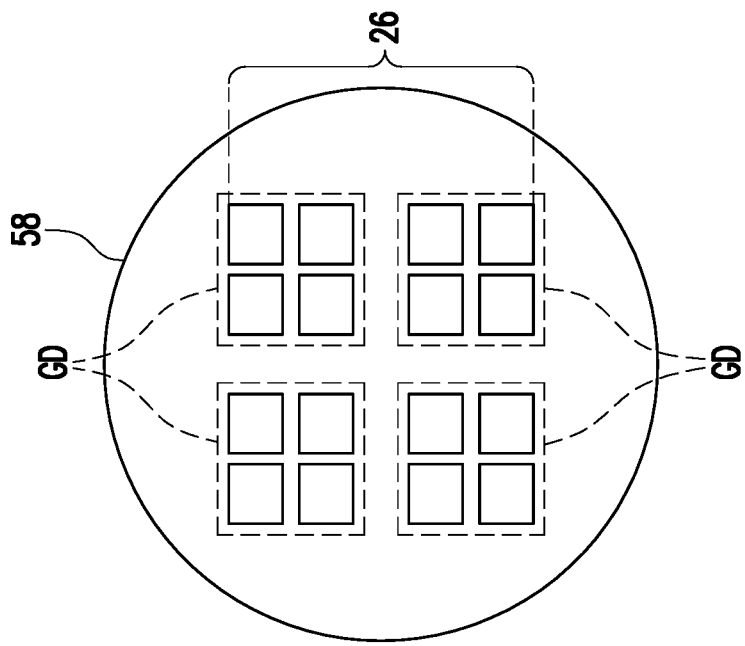
FIGS. 22 through 25 illustrate die groups in reconstructed wafers in accordance with some embodiments.
Figure 22:
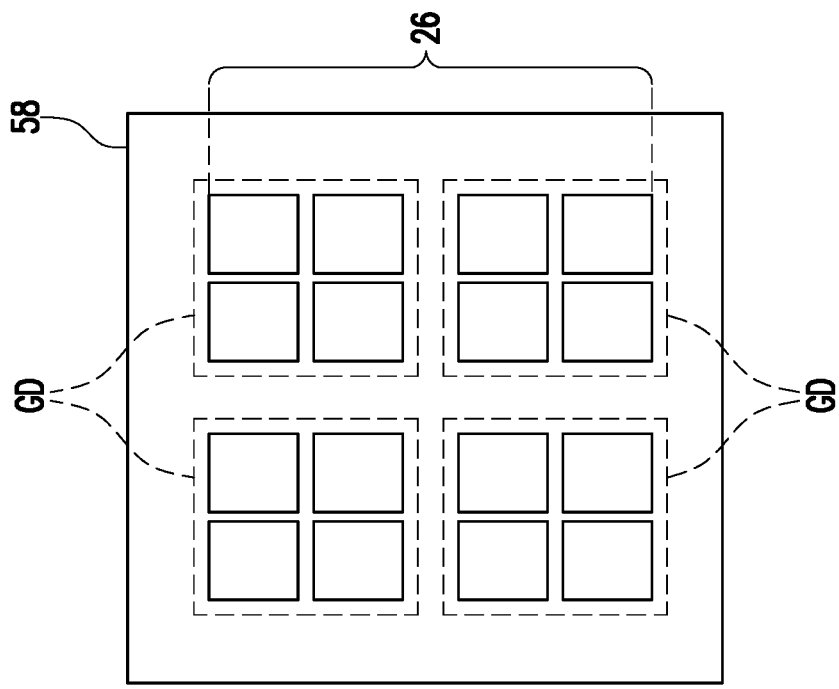
Figure 25:
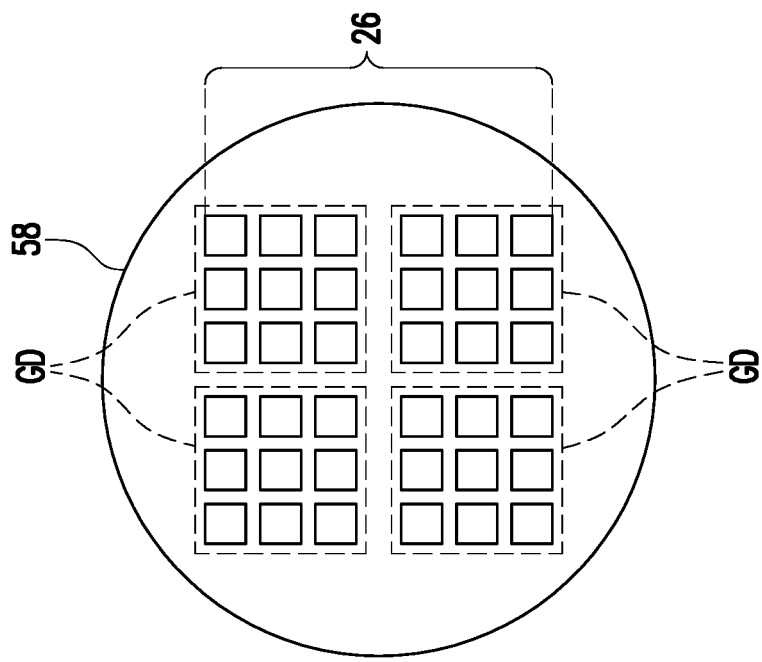
Figure 24:
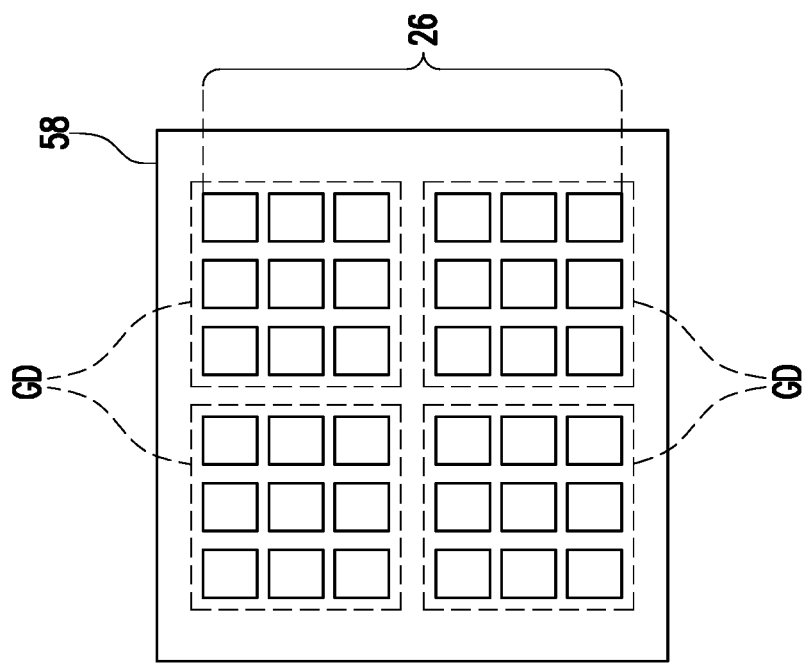

FIGS. 22, 23, 24, and 25 illustrate the package component groups GD in accordance with some embodiments. The cross-wafer RDLs are not shown, while the cross-wafer RDLs may be similar to that shown in FIGS. 16 through 21. For example, FIG. 22 illustrates a rectangular reconstructed wafer 58 including package component groups GD, with each group including a 2×2 array of package components 26. FIG. 23 illustrates a round reconstructed wafer 58 including package component groups GD, with each group including a 2×2 array of package components 26. FIG. 24 illustrates a rectangular reconstructed wafer 58 including package component groups GD, with each group including a 3×3 array of package components 26. FIG. 25 illustrates a round reconstructed wafer 58 including package component groups GD, with each group including a 3×3 array of package components 26.

Figures 26, 27:
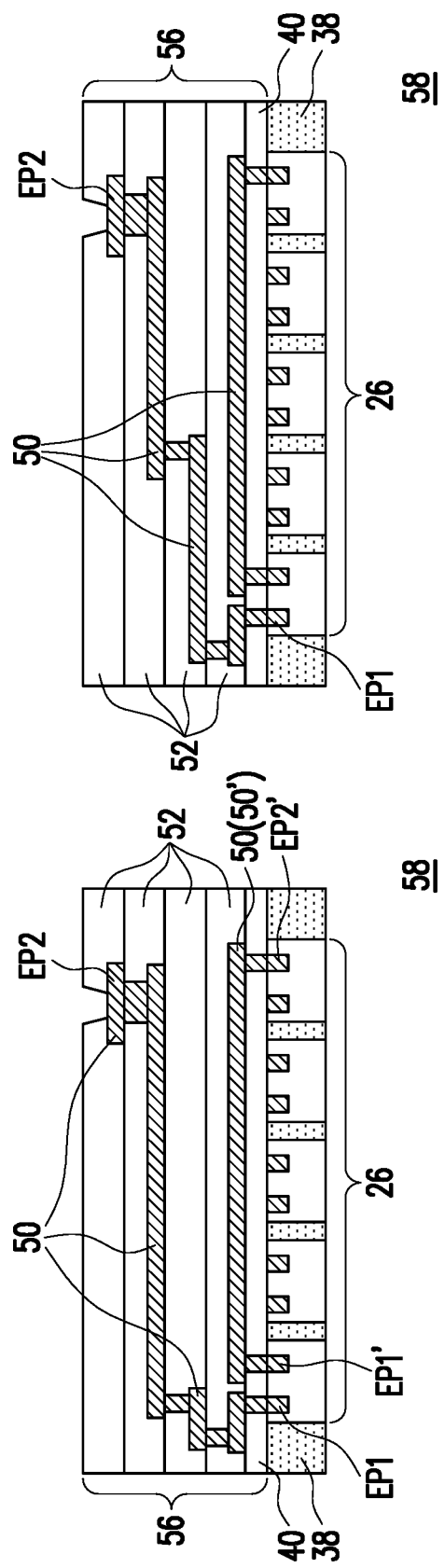

FIGS. 26 through 33 illustrate the cross-sectional views of cross-wafer RDLs 50 and their distribution schemes in a plurality of dielectric layers 52 and 40. For example, FIG. 26 illustrates a cross-wafer RDL 50 with end point EP1 being a conductive pad/pillar of one of package component 26, and end point EP2 being a top conductive feature of reconstructed wafer 58, which top conductive feature may overlap a package component closest to an edge of the reconstructed wafer 58. End points EP1 and EP2 are close to the opposite side edges (left side edge and right side edge, for example) of reconstructed wafer 58. The RDL 50 in one of dielectric layers 52 extends substantially from the left side edge to the right side edge of reconstructed wafer 58. Furthermore, one of RDLs 50 (marked as 50') in the bottom dielectric layer 40 and the dielectric layer 52 immediately over dielectric layer 40 has end points EP1' and EP2', wherein the corresponding RDL 50 alone is a cross-wafer RDL, which extends substantially from the left side edge to the right side edge of reconstructed wafer 58.

FIG. 27 illustrates cross-wafer RDLs in accordance with some embodiments. A cross-wafer RDL 50 has end points EP1 and EP2, which are close to opposite side edges (the left side edge and right side edge, for example) of reconstructed wafer 50. In accordance with some embodiments, two RDLs, each in a dielectric layer, in combination extend substantially from the left side edge to the right side edge of reconstructed wafer 58 to form the cross-wafer RDL.

Figure 29:
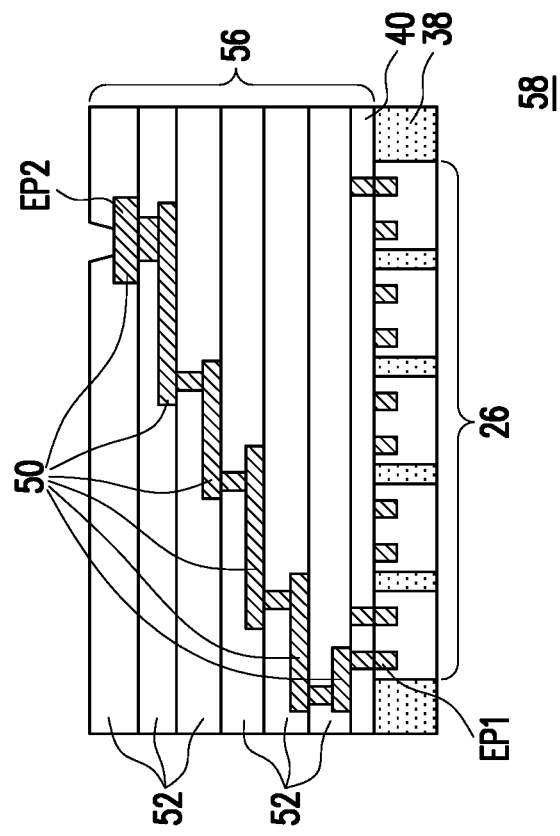
Figure 28:
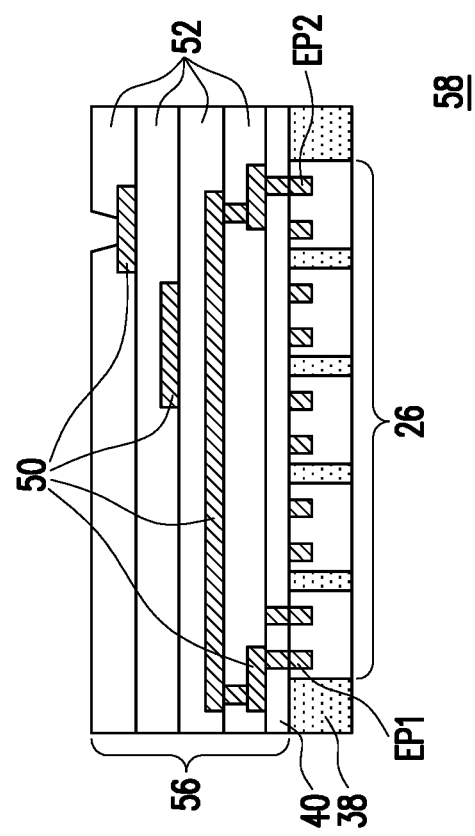

FIG. 28 illustrates some embodiments in which both end points EP1 and EP2 are the conductive features of package components 26. In accordance with some embodiments, both end points EP1 and EP2 are in the package components 26 that are closest to the respective edges of reconstructed wafer 58. In accordance with alternative embodiments, one or both of end points EP1 and EP2 are in a package component(s) 26 that is not closest to any edge of reconstructed wafer 58. FIG. 28 illustrates an RDL 48 in one dielectric layer 52 extending substantially from the left side edge to the right side edge of reconstructed wafer 58. FIG. 29 illustrates that the distance from the left side edge to the right side edge of reconstructed wafer 58 is substantially shared equally by the RDLs in multiple dielectric layers.

Figure 33:
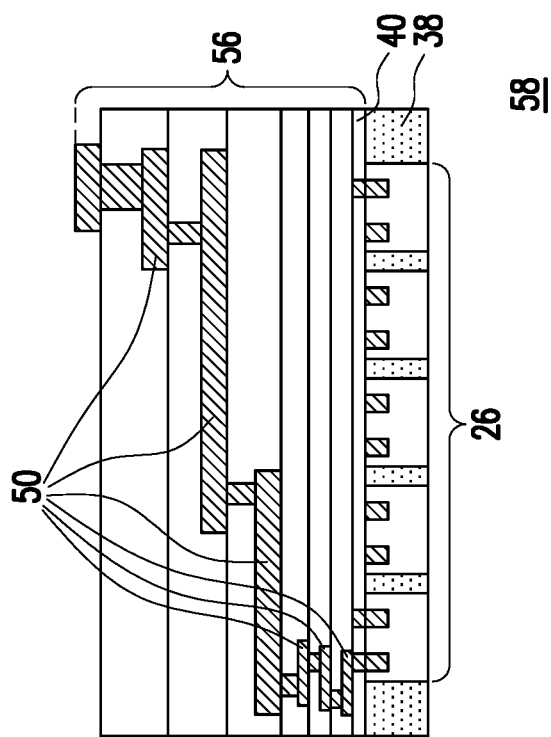
Figure 32:
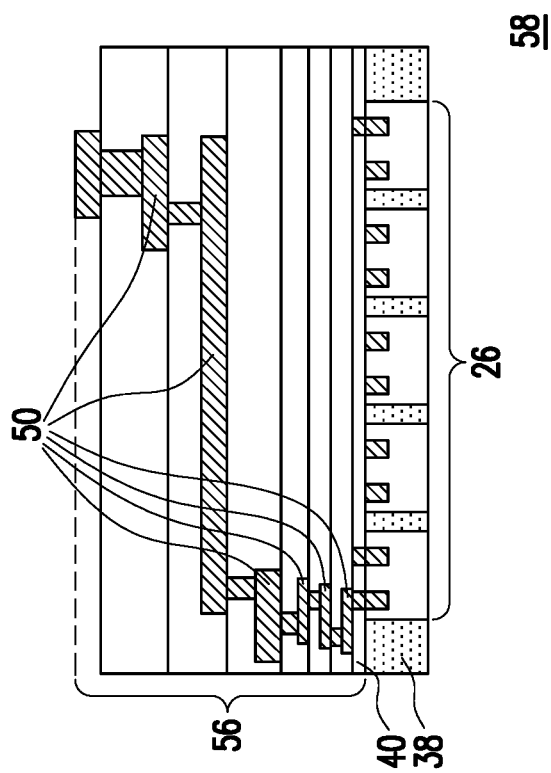

FIGS. 30 through 33 illustrate some embodiments in which upper dielectric layers 52 are thicker than the lower dielectric layers 52 and 40. Accordingly, the upper RDLs 50 are thicker than lower RDLs 50. For example, thicknesses T1 through T6 are marked in FIG. 30. Thicknesses T4, T5, and T6 are greater than thicknesses T1, T2, and T3. For example, the ratio of thickness T4/T5/T6 to the thickness T1/T2/T3 may be greater than about 1.5, and may be in the range between about 1.5 and 3.0. Thicknesses T4, T5, and T6 may be in the range between about 8 µm and about 30 µm, with an example of the thicknesses being about 15 µm. To reduce the resistance of cross-wafer RDLs, the majority of the length of the cross-wafer RDLs may be distributed in the thicker dielectric layers. For example, FIG. 30 illustrates a top RDL 50 extending substantially from the left side edge to the right side edge of reconstructed wafer 58. FIG. 31 illustrates a middle thick RDL 50 extending substantially from the left side edge to the right side edge of reconstructed wafer 58. FIGS. 32 and 33 illustrate that the lower RDLs extend a small portion of the cross-wafer distance, and the main portion of the cross-wafer distance is covered by the upper RDLs in thicker dielectric layers. In accordance with some embodiments, the lower thin RDLs are substantially used for connecting to upper layers, and are not used for significant lateral routing, and upper thick layers are used for lateral routing, as shown in FIGS. 31 through 33. In accordance with some embodiments, the lower thin RDLs in FIGS. 31 through 33 are metal pads, with upper metal pads overlapping lower metal pads, and the vias for interconnecting the metal pads are vertical misaligned. When the metal pads are routed to a thick metal layer, the routing becomes lateral.

Figure 34:
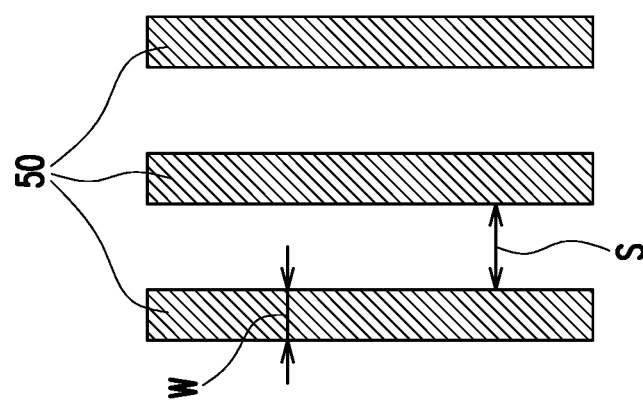
FIG. 34 illustrates a top view of some RDLs in accordance with some embodiments.

FIG. 34 illustrates a top view of a portion of some RDLs 50 in accordance with some embodiments of the present disclosure. The width W of the thicker RDLs 50 (FIGS. 30 through 33, the upper RDLs) may be in the range between about 15 µm and about 200 µm, and may be equal to about 15 µm as an example. The width W of the thinner RDLs 50 (FIGS. 30 through 33 with thicknesses T1, T2, and T3) may be in the range between about 5 µm and about 20 µm. The spacing S between neighboring RDLs may be greater than about 20 µm, and may be in the range between about 20 µm and about 50 µm. The ratio of thickness T1 through T6 (FIGS. 30 through 33, marked in FIG. 30) to width W (FIG. 34) may be in the range between about 0.5 and about 2.0. The ratio S/W may be in the range between about 0.5 and about 3.0.

It is appreciated that various embodiments have been illustrated in FIGS. 14 through 34. These embodiments, whenever applicable, may be incorporated into the same reconstructed wafer 58. For example, the routing schemes as shown in two or more (or all) of FIGS. 26 and 33 may be present in the same reconstructed wafer 58 in any combination. In addition, the cross-wafer RDLs may be formed to connect any of the package components 26 to all other package components 26, so that a one-to-one connection may be established between any two package components 26 in reconstructed wafer 58. Furthermore, the illustrated top views and the illustrated cross-sectional views may correspond to each other whenever possible.

In above-illustrated embodiments, some processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming cross-wafer RDLs, any two package components in the same reconstructed wafer may be interconnected through cross-wafer RDLs without the need of going through solder regions, dies, packages, repeaters or the like. The resistance values of the RDLs are thus reduced, especially for the cross-wafer RDLs that extend across substantially the entire reconstructed wafers. The performance of the high-speed computing is thus improved. Signal integrity may be improved, insertion loss may be reduced, and noise may be reduced.

In accordance with some embodiments of the present disclosure, a method of forming a semiconductor device comprises placing a plurality of package components over a carrier; encapsulating the plurality of package components in an encapsulant; forming a light-sensitive dielectric layer over the plurality of package components and the encapsulant; exposing the light-sensitive dielectric layer using a first lithography mask; developing the light-sensitive dielectric layer to form a plurality of openings, wherein conductive features of the plurality of package components are exposed through the plurality of openings; and forming redistribution lines extending into the openings, wherein one of the redistribution lines has a length greater than about 26 mm, and the redistribution lines, the plurality of package components, the encapsulant in combination form a reconstructed wafer. In an embodiment, the first lithography mask is large enough to cover all package components over the carrier. In an embodiment, the forming the redistribution lines comprises: coating a plating mask; patterning the plating mask using a second lithography mask large enough to cover all package components over the carrier; and plating the redistribution lines in openings in the plating mask, wherein the one of the redistribution lines having the length greater than about 26 mm is formed by the plating. In an embodiment, the method further comprises de-bonding the reconstructed wafer from the carrier; and bonding the reconstructed wafer to a package component selected from the group consisting essentially of an interposer, a package substrate, a printed circuit board, a thermal module, and combinations thereof. In an embodiment, the reconstructed wafer that has been bonded to the package component has a round top-view shape. In an embodiment, the reconstructed wafer is un-sawed before being bonded to the package component. In an embodiment, the method further comprises securing the reconstructed wafer to the package component through a bolt that penetrates through the reconstructed wafer. In an embodiment, the plurality of package components are placed as a plurality of groups, with inner-group spacings between package components in a same group being smaller than inter-group spacings between neighboring ones of the plurality of groups. In an embodiment, the redistribution lines are in a plurality of redistribution layers, and wherein upper layers of the plurality of redistribution layers are thicker than lower layers of the plurality of redistribution layers.

In accordance with some embodiments of the present disclosure, a method of forming a semiconductor device comprises encapsulating a plurality of device dies in an encapsulant; and forming redistribution lines over and electrically coupling to the plurality of device dies, wherein the plurality of device dies, the encapsulant, and the redistribution lines are parts of a reconstructed wafer, and the reconstructed wafer comprises: a first side edge; a second side edge, wherein the first side edge and the second side edge are opposite side edges of the reconstructed wafer; a first device die close to the first side edge; and a second device die close to the second side edge, wherein a cross-wafer redistribution line is formed to comprise at least one of the redistribution lines, and the cross-wafer redistribution line has a first end connecting to the first device die, and a second end connecting to or overlapping the second device die. In an embodiment, all redistribution lines in a same layer are formed using a same light-exposure process. In an embodiment, the same light-exposure process is performed using a lithography mask large enough to cover all of the encapsulant. In an embodiment, the second end is at a top surface of the reconstructed wafer, and the second end overlaps the second device die. In an embodiment, the second end is connected to the second device die. In an embodiment, the cross-wafer redistribution line has a length greater than about 26 mm. In an embodiment, the method further comprises, without sawing the reconstructed wafer, bonding the reconstructed wafer to a package component selected from the group consisting essentially of an interposer, a package substrate, a printed circuit board, a thermal module, and combinations thereof.

In accordance with some embodiments of the present disclosure, method of forming a semiconductor device comprises forming a reconstructed wafer comprising: molding a plurality of device dies in a molding compound; forming a plurality of redistribution layers electrically coupling to the plurality of device dies, wherein the plurality of redistribution layers form a plurality of cross-wafer redistribution lines, each connecting a pair of the plurality of device dies, wherein each of the cross-wafer redistribution lines comprises redistribution lines in at least one of the plurality of redistribution layers; and bonding the reconstructed wafer to a thermal module. In an embodiment, the plurality of cross-wafer redistribution lines form one-to-one connection for each pair of the plurality of device dies. In an embodiment, the method further comprises securing the reconstructed wafer to the thermal module. In an embodiment, one of the cross-wafer redistribution lines has a tracing length greater than about 26 mm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A structure comprising:
    a reconstructed wafer comprising:
        a plurality of device dies allocated as a plurality of groups, wherein the plurality of groups are identical to each other, and wherein the plurality of groups comprise a first device die group and a second device die group;
an encapsulant encapsulating the plurality of device dies therein; and
a plurality of redistribution lines over and electrically inter-coupling the first device die group and the second device die group, wherein the first device die group is closer to a first corner of the reconstructed wafer than all other groups in the plurality of groups, and the second device die group is closer to a second corner of the reconstructed wafer than all other groups in the plurality of groups; and
a thermal module attached to the reconstructed wafer.

2. The structure of claim 1, wherein the plurality of redistribution lines comprise a cross-wafer redistribution line, with the cross-wafer redistribution line interconnecting the first device die group and the second device die group.

3. The structure of claim 2, wherein the cross-wafer redistribution line comprises:
a first terminal overlapping a first die in the first device die group; and
a second terminal overlapping a second die in the second device die group, wherein the first terminal and the second terminal are at opposite ends of the reconstructed wafer.

4. The structure of claim 1 further comprising a package substrate joined to the reconstructed wafer.

5. The structure of claim 4 further comprising a package component over and joined to the package substrate, wherein the package component is selected from the group consisting of a package, a voltage regulator module, a power supply module, a passivation device die, and an IO connector.

6. The structure of claim 1, wherein the reconstructed wafer has a rectangular top-view shape, and wherein the first device die group and the second device die group are at opposite corners of the reconstructed wafer.

7. The structure of claim 1, wherein the reconstructed wafer has a round top-view shape, and wherein the first device die group and the second device die group are at opposite ends of a diameter of the reconstructed wafer.

8. The structure of claim 1 further comprising a bolt penetrating through the reconstructed wafer.

9. The structure of claim 8, wherein the bolt secures the thermal module to the reconstructed wafer.

10. The structure of claim 1, wherein each of the plurality of groups comprises multiple dies having different structures.

11. A structure comprising:
a reconstructed wafer comprising:
a plurality of device dies;
an encapsulant encapsulating the plurality of device dies, wherein in a top view of the reconstructed wafer, the encapsulant comprises a curved edge comprising a first portion and a second portion on opposite sides of the plurality of device dies, and wherein the first portion and the second portion are adjacent to a first end and a second end, respectively, of a diameter of the reconstructed wafer; and
a cross-wafer redistribution line electrically interconnecting a first device die to a second device die in the plurality of device dies, wherein the first device die is closer to the first portion of the curved edge than all other device dies in the plurality of device dies, and the second device die is closer to the second portion of the curved edge than all other device dies in the plurality of device dies;
a bolt penetrating through the reconstructed wafer; and
a screw attached to the bolt.

12. The structure of claim 11 further comprising a thermal module attached to the reconstructed wafer.

13. The structure of claim 11 further comprising a package substrate joined to and electrically connected to the reconstructed wafer.

14. The structure of claim 11, wherein the cross-wafer redistribution line comprises a plurality of redistribution lines and a plurality of vias interconnecting neighboring ones of the plurality of redistribution lines.

15. The structure of claim 11, wherein the plurality of device dies comprise a plurality of groups identical to each other, and wherein device dies in each of the plurality of groups are different from each other.

16. The structure of claim 15, wherein each of the plurality of device die groups comprises a logic die and an additional die selected from a memory die, a passive die, and an input-output die.

17. The structure of claim 15, wherein the plurality of device die groups comprise a first group and a second group, wherein the first group is closer to the first end of the diameter than all other groups of the plurality of device die groups, and the second group is closer to the second end of the diameter than all other groups of the plurality of device die groups, and the cross-wafer redistribution line connects the first group to the second group.

18. A structure comprising:
a reconstructed wafer comprising:
a plurality of device dies;
a molding compound encapsulating the plurality of device dies; and
a plurality of redistribution layers over and electrically coupling to the plurality of device dies, wherein the plurality of redistribution layers comprise a plurality of cross-wafer redistribution lines, each interconnecting a pair of the plurality of device dies;
a thermal module attached to the reconstructed wafer, and
a package component bonding to the reconstructed wafer, wherein the thermal module and the package component are on opposite sides of the reconstructed wafer.

19. The structure of claim 18, wherein the package component comprises a package substrate, and the structure further comprises a die joining to the package substrate.

20. The structure of claim 19, wherein the die and the reconstructed wafer are on a same side of the package substrate.

* * * * *